United States Patent
Hyun et al.

(10) Patent No.: US 11,735,698 B2
(45) Date of Patent: Aug. 22, 2023

(54) LIGHT-EMITTING DEVICE AND HEAD LAMP FOR VEHICLES INCLUDING THE LIGHT EMITTING DEVICE

(71) Applicant: SAMSUNG ELECTRONICS CO., LTD., Suwon-si (KR)

(72) Inventors: Jaesung Hyun, Suwon-si (KR); Namhyeok Kwak, Seoul (KR); Gunduk Kim, Seongnam-si (KR); Dohun Kim, Seoul (KR); Junho Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/548,114

(22) Filed: Dec. 10, 2021

(65) Prior Publication Data
US 2022/0209077 A1    Jun. 30, 2022

(30) Foreign Application Priority Data

Dec. 29, 2020 (KR) .................. 10-2020-0186780

(51) Int. Cl.
| | |
|---|---|
| *H01L 33/50* | (2010.01) |
| *F21S 41/176* | (2018.01) |
| *H01L 33/62* | (2010.01) |
| *H01L 27/15* | (2006.01) |
| *H01L 33/22* | (2010.01) |
| *F21S 41/153* | (2018.01) |

(52) U.S. Cl.
CPC .......... *H01L 33/505* (2013.01); *F21S 41/153* (2018.01); *F21S 41/176* (2018.01); *H01L 27/156* (2013.01); *H01L 33/22* (2013.01); *H01L 33/62* (2013.01)

(58) Field of Classification Search
CPC ....... H01L 33/505; H01L 33/22; H01L 33/62; H01L 27/156; F21S 41/153; F21S 41/156; F21S 41/176
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |

(Continued)

FOREIGN PATENT DOCUMENTS

KR    10-2019-0056853 A    5/2019

*Primary Examiner* — Evan P Dzierzynski
*Assistant Examiner* — Nathaniel J Lee
(74) *Attorney, Agent, or Firm* — Sughrue Mion, PLLC

(57) ABSTRACT

A light-emitting device is provided. The light-emitting device includes a plurality of first light-emitting structures provided in a first light-emitting pixel region; a plurality of second light-emitting structures provided in a second light-emitting pixel region adjacent to the first light-emitting pixel region; a barrier wall structure defining a plurality of regions in the first light-emitting pixel region and a single region in the second light-emitting pixel region; a first fluorescent layer provided in the plurality of regions; and a second fluorescent layer provided in the single region. The first fluorescent layer and the second fluorescent layer have different shapes.

20 Claims, 27 Drawing Sheets

(56) References Cited

U.S. PATENT DOCUMENTS

| | | |
|---|---|---|
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,091,415 B2 | 7/2015 | Bessho et al. |
| 9,182,631 B2 | 11/2015 | Iwata et al. |
| 10,158,057 B2 | 12/2018 | Orsley et al. |
| 2009/0058259 A1 | 3/2009 | Janning |
| 2018/0047780 A1* | 2/2018 | Yeon .................... H01L 27/156 |
| 2019/0189684 A1 | 6/2019 | Chamberlin et al. |
| 2019/0326349 A1 | 10/2019 | Kwon et al. |
| 2020/0025351 A1* | 1/2020 | Kwon .................. H01L 33/505 |
| 2020/0144458 A1 | 5/2020 | Lee et al. |
| 2020/0166196 A1 | 5/2020 | Wu |
| 2020/0194417 A1 | 6/2020 | Yeon et al. |
| 2020/0212100 A1 | 7/2020 | Masui et al. |

\* cited by examiner

LIGHT-EMITTING DEVICE AND HEAD LAMP FOR VEHICLES INCLUDING THE LIGHT EMITTING DEVICE

CROSS-REFERENCE TO RELATED APPLICATION

This application is based on and claims priority under 35 U.S.C. § 119 to Korean Patent Application No. 10-2020-0186780, filed on Dec. 29, 2020, in the Korean Intellectual Property Office, the disclosure of which is incorporated by reference herein in its entirety.

BACKGROUND

Methods, apparatuses and systems consistent with example embodiments relate to a light-emitting device and a head lamp for vehicles, and more particularly, to a pixel-type semiconductor light-emitting device and a head lamp for vehicles including the pixel-type semiconductor light-emitting device.

Semiconductor light-emitting devices are used as light sources in various electronic products. Recently, in particular, semiconductor light-emitting devices have been widely used in vehicles such as automobiles. Thus, it is necessary to optimize the operation and manufacturing of the semiconductor light-emitting devices by harmonizing the characteristics of vehicles and the characteristics of semiconductor light-emitting devices, and accordingly, research on this matter is ongoing.

SUMMARY

Example embodiments provide a pixel-type semiconductor light-emitting device having good optical characteristics and high reliability, and a head lamp for vehicles including the pixel-type semiconductor light-emitting device.

Additional aspects will be set forth in part in the description which follows and, in part, will be apparent from the description, or may be learned by practice of example embodiments.

According to an aspect of an example embodiment, a light-emitting device includes a plurality of first light-emitting structures provided in a first light-emitting pixel region; a plurality of second light-emitting structures provided in a second light-emitting pixel region adjacent to the first light-emitting pixel region; a barrier wall structure defining a plurality of regions in the first light-emitting pixel region and a single region in the second light-emitting pixel region; a first fluorescent layer provided in the plurality of regions; and a second fluorescent layer provided in the single region, wherein a shape of the first fluorescent layer is different from a shape of the second fluorescent layer.

According to aspect of an example embodiment, a light-emitting device includes: a plurality of light-emitting structures provided in a light-emitting pixel region; a barrier wall structure that is vertically offset from the plurality of light-emitting structures in the light-emitting pixel region, the barrier wall structure including a plurality of barrier walls that define a plurality of pixel spaces; a fluorescent layer provided in the plurality of pixel spaces; and a pad portion provided in a pad region on a first side of the plurality of light-emitting structures. The light-emitting pixel region includes a first light-emitting pixel region and a second light-emitting pixel region, the fluorescent layer includes a plurality of first fluorescent layers respectively provided on the plurality of light-emitting structures provided in the first light-emitting pixel region, and the fluorescent layer includes a continuous fluorescent layer continuously provided on the plurality of light-emitting structures in the second light-emitting pixel region.

According to an aspect of an example embodiment, a head lamp includes first light-emitting structures provided in a first light-emitting pixel region; a plurality of second light-emitting structures provided in a second light-emitting pixel region being adjacent to the first light-emitting pixel region; a barrier wall structure defining a plurality of regions in the first light-emitting pixel region and a single region in the second light-emitting pixel region; first fluorescent layers provided in the first light-emitting pixel region; and a second fluorescent layer provided in the second light-emitting pixel region, wherein a shape of the first fluorescent layers and is different from a shape of the second fluorescent layer.

According to an aspect of an example embodiment, a head lamp includes a light-emitting device. The light-emitting device includes: a plurality of light-emitting pixel regions defined by a plurality of light-emitting structures; and a plurality of barrier walls. The plurality of light-emitting pixel regions include a first light-emitting pixel region and a second light-emitting pixel region. Individual fluorescent layers are respectively provided on each of the plurality of light-emitting structures in the first light-emitting pixel region. One fluorescent layer is provided on each of the plurality of light-emitting structures in the second light-emitting pixel region.

BRIEF DESCRIPTION OF THE DRAWINGS

The above and other aspects, features, and advantages will be more clearly understood from the following description taken in conjunction with the accompanying drawings in which.

DETAILED DESCRIPTION

Example embodiments will now be described more fully with reference to the accompanying drawings.

Figure 1:
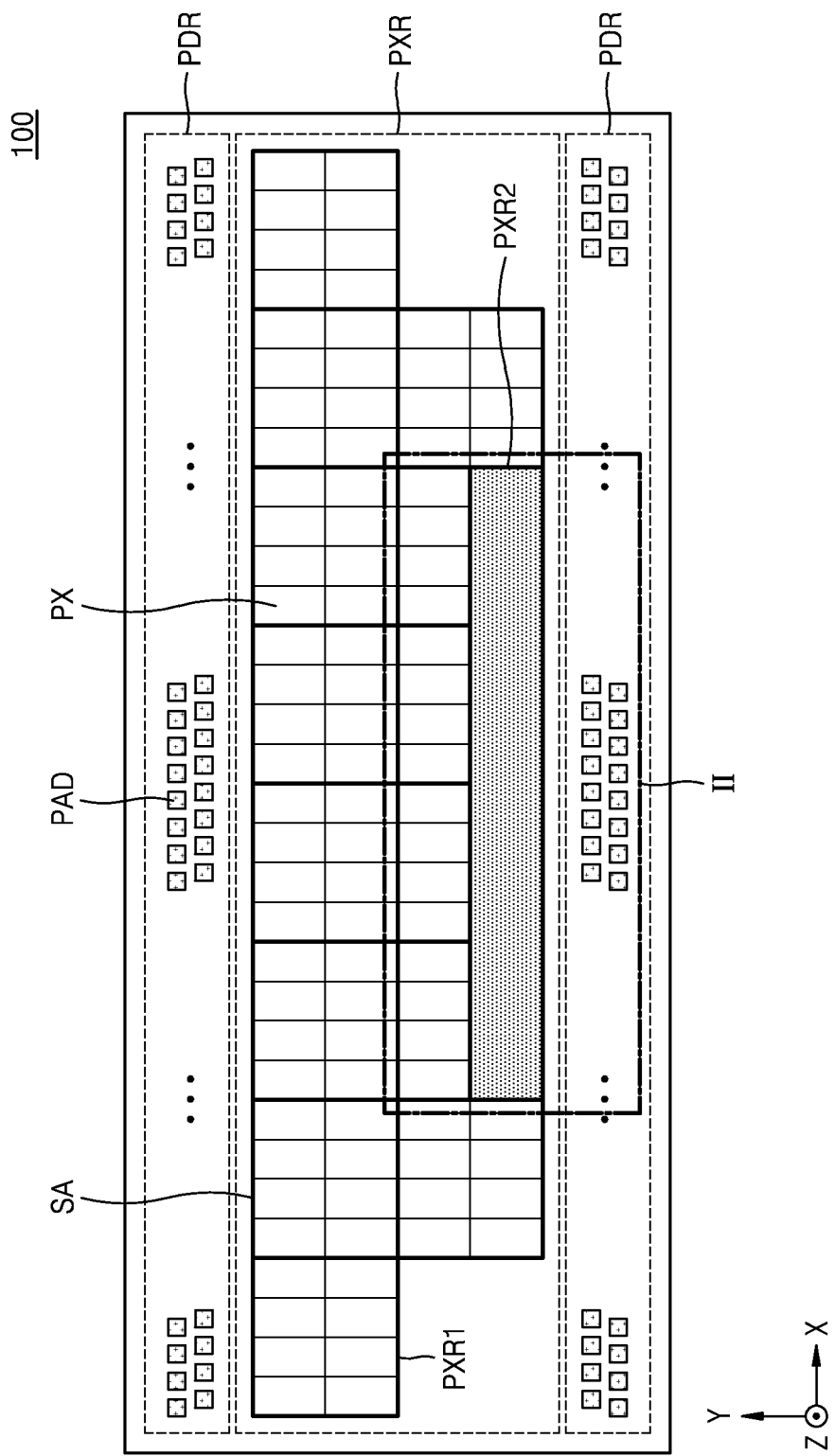
FIG. 1 is a plan view of a light-emitting device according to an example embodiment.
Figure 2:
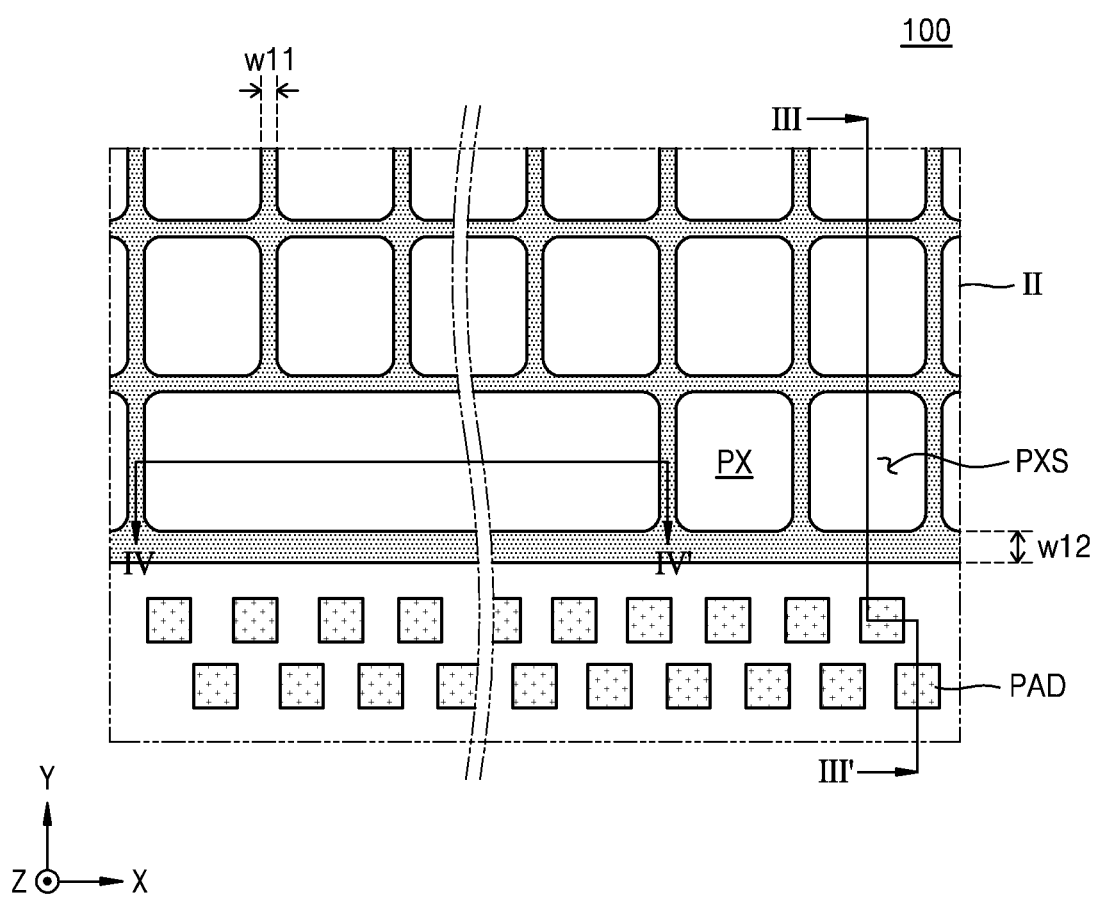
FIG. 2 is a magnified view of a portion II of FIG. 1.
Figure 3:
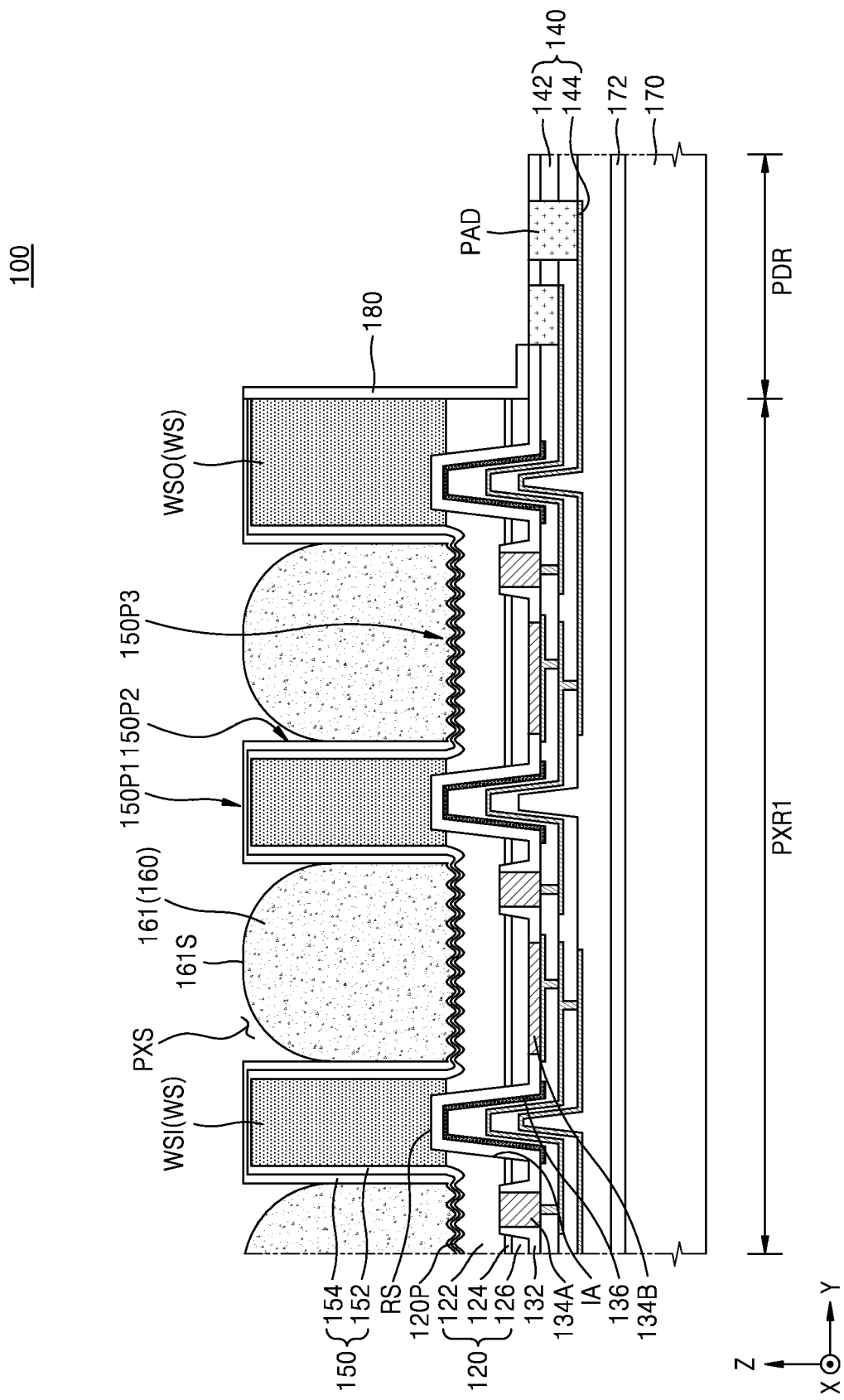
FIG. 3 is a cross-sectional view taken along line III-III' of FIG. 2.
Figure 4:
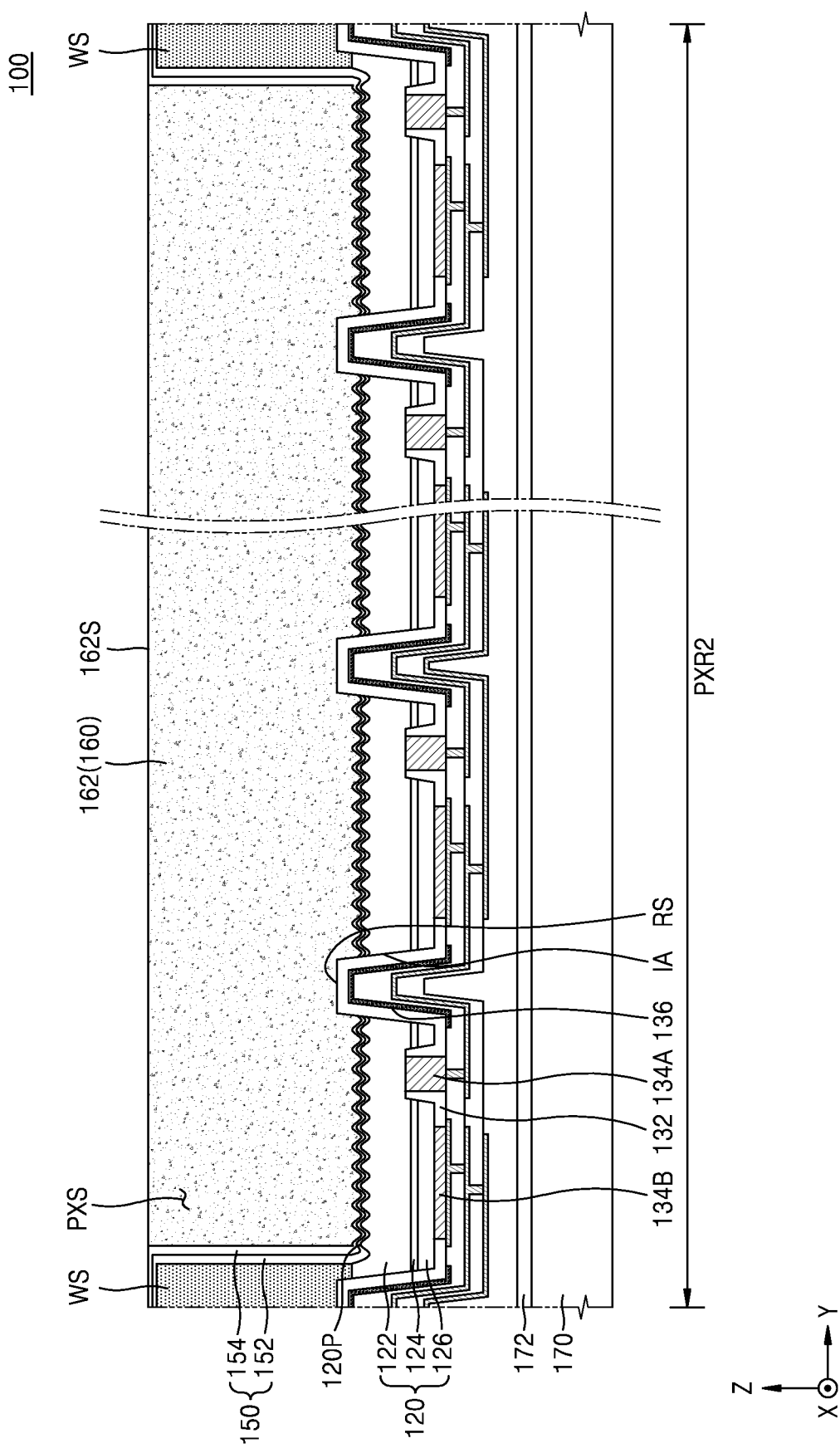
FIG. 4 is a cross-sectional view taken along line IV-IV' of FIG. 2.

FIG. 1 is a plan view of a light-emitting device according to an example embodiment, FIG. 2 is a magnified view of a portion ∥ of FIG. 1, FIG. 3 is a cross-sectional view taken along line III-III' of FIG. 2, and FIG. 4 is a cross-sectional view taken along line IV-IV' of FIG. 2.

Referring to FIGS. 1 through 4, a light-emitting device 100 may include a light-emitting pixel region PXR and a pad region PDR arranged on at least one side of the light-emitting pixel region PXR.

A plurality of pixels PX may be arranged in a matrix configuration on the light-emitting pixel region PXR, and a light-emitting structure 120 may be arranged within each of the plurality of pixels PX. A pad portion PAD electrically connected to the light-emitting structure 120 arranged in each of the plurality of pixels PX may be arranged on the pad region PDR. As will be described later, the light-emitting pixel region PXR may include a first light-emitting pixel region PXR1 and a second light-emitting pixel region PXR2.

In a plan view, the light-emitting pixel region PXR may occupy an area corresponding to about 50% to about 90% of the entire area of the light-emitting device 100, and the pad region PDR may occupy an area corresponding to about 10% to about 50% of the entire area of the light-emitting device 100; however, example embodiments are not limited thereto. In a plan view, each of the plurality of pixels PX may have a width of about 10 µm to several mm in an X direction or a Y direction; however, example embodiments are not limited thereto.

The light-emitting device 100 may include a plurality of sub-arrays SA, each of which may include a plurality of pixels PX. For example, in the drawings, the light-emitting device 100 includes the plurality of sub-arrays SA, each of which includes a plurality of pixels PX arranged in a matrix form. However, example embodiments are not limited thereto.

According to some example embodiments, the plurality of sub-arrays SA may be electrically separated from one another, and the plurality of pixels PX included in one sub-array SA may be serially connected to one another. For example, each of the plurality of sub-arrays SA may be electrically connected to the same driving semiconductor chip 1200 of FIG. 18 so that one driving semiconductor chip 1200 of FIG. 18 may be configured to control one sub-array SA. In this case, the number of sub-arrays SA may be equal to the number of driving semiconductor chips 1200 of FIG. 18. According to other example embodiments, pixels PX included in at least one of the plurality of sub-arrays SA may be connected to each other in parallel.

A barrier wall structure WS may be arranged on at least some of the plurality of light-emitting structures 120. The barrier wall structure WS may include a plurality of inner barrier walls WSI defining a plurality of pixel spaces PXS and an outer barrier wall WSO arranged at an outermost side of the plurality of inner barrier walls WSI within the pixel region PXR. A pixel PX may be arranged within each of the plurality of pixel spaces PXS.

Each of the plurality of inner barrier walls WSI may have a first width w11 of about 10 µm to about 100 µm in a horizontal direction (X direction or Y direction). The outer barrier wall WSO may have a second width w12 of about 10 µm to about 1 mm in the horizontal direction (X direction or Y direction). The barrier wall structure WS may be formed such that the first width w11 of each inner barrier wall WSI is less than the second width w12 of the outer barrier wall WSO, and thus structural stability of the light-emitting device 100 may improve. For example, even in an environment where repetitive vibrations and impacts are applied, such as a case where the light-emitting device 100 is used as a head lamp for vehicles, the light-emitting device 100 may have improved reliability due to good structural stability between fluorescent layers 160 arranged in the barrier wall structure WS and the barrier wall structure WS.

The plurality of light-emitting structures 120 may include a first conductive type semiconductor layer 122, an active layer 124, and a second conductive type semiconductor layer 126. An insulation liner 132, first contacts 134A, second contacts 134B, and a wiring structure 140 may be arranged on lower surfaces of the plurality of light-emitting structures 120.

For convenience of explanation, surfaces of the light-emitting structures 120 facing the plurality of inner barrier walls WSI may be referred to as upper surfaces of the light-emitting structures 120, and surfaces (i.e., surfaces far from the plurality of inner barrier walls) of the light-emitting structures 120 opposite to the upper surfaces of the light-emitting structures 120 may be referred to as the lower surfaces of the light-emitting structures 120. For example, the first conductive type semiconductor layer 122, the active layer 124, and the second conductive type semiconductor layer 126 may be stacked in a vertical direction from the upper surface of the light-emitting structure 120 to the lower surface thereof, and thus, the upper surface of the light-emitting structure 120 may correspond to an upper surface of the first conductive type semiconductor layer 122 and the lower surface of the light-emitting structure 120 may correspond to a lower surface of the second conductive type semiconductor layer 126.

The first conductive type semiconductor layer 122 may include a nitride semiconductor having a composition of n-type $In_xAl_yGa_{(1-x-y)}N$ ($0 \le x < 1$, $0 \le y < 1$, $0 \le x+y < 1$), and n-type impurities may be, for example, silicon (Si). Alternatively, the first conductive type semiconductor layer 122 may include gallium nitride (GaN) including n-type impurities.

According to some example embodiments, the first conductive type semiconductor layer 122 may include a first conductive type semiconductor contact layer and a current diffusion layer. An impurity concentration of the first conductive type semiconductor contact layer may be in the range of about $2 \times 10^{18}$ cm$^{-3}$ to about $9 \times 10^{19}$ cm$^{-3}$. The first conductive type semiconductor contact layer may have a thickness of about 1 µm to about 5 µm. The current diffusion layer may have a structure in which a plurality of $In_xAl_yGa_{(1-x-y)}N$ ($0 \le x$, $y \le 1$, $0 \le x+y \le 1$) layers having different compositions or having different impurity contents are alternately stacked. For example, the current diffusion layer may have an n-type superlattice structure in which n-type GaN layers and/or $Al_xIn_yGa_zN$ layers ($0 \le x,y,z \le 1$, $x+y+z \ne 0$) each having a thickness of about 1 nm to about 500 nm are alternately stacked. An impurity concentration of the current diffusion layer may be in the range of about $2 \times 10^{18}$ cm$^{-3}$ to about $9 \times 10^{19}$ cm$^{-3}$.

The active layer 124 may be arranged between the first conductive type semiconductor layer 122 and the second conductive type semiconductor layer 126. The active layer 124 may be configured to emit light having certain energy by recombination of electrons and holes, when the light-emitting device 100 is driven. The active layer 124 may have a multiple quantum well (MQW) structure in which a quantum well layer and a quantum barrier layer are alternately stacked. For example, the quantum well layer and the quantum barrier layer may include $In_xAl_yGa_{(1-x-y)}N$ (0≤x, y≤1, 0≤x+y≤1) having different compositions. The quantum well layer may include $In_xGa_{1-x}N$ (0≤x≤1), and the quantum barrier layer may include GaN or AlGaN. Each of the quantum well layer and the quantum barrier layer has a thickness of about 1 nm to about 50 nm. The active layer 24 is not limited to an MQW structure, and for example, may have a single quantum well (SQW) structure.

The second conductive type semiconductor layer 126 may include a nitride semiconductor having a composition of p-type $In_xAl_yGa_{(1-x-y)}N$ (0≤x<1, 0≤y<1, 0≤x+y<1), and p-type impurities may be, for example, magnesium (Mg).

According to some example embodiments, the second conductive type semiconductor layer 126 may include an electron blocking layer, a low-concentration p-type GaN layer, and a high-concentration p-type GaN layer stacked in the vertical direction. For example, the electron blocking layer may have a structure in which a plurality of $In_xAl_yGa_{(1-x-y)}N$ (0≤x, y<1, 0≤x+y≤1) layers each having a thickness of about 5 nm to about 100 nm and having different compositions are alternately stacked, or may be a single layer including $Al_yGa_{(1-y)}N$ (0<y≤1). An energy bandgap of the electron blocking layer may decrease in a direction away from the active layer 24. For example, an Al composition of the electron blocking layer may decrease in a direction away from the active layer 24.

Each of the plurality of light-emitting structures 120 may be arranged spaced apart from an adjacent light-emitting structure 120 with an isolation area IA therebetween. A distance between the plurality of light-emitting structures 120 may be less than the first width w11 of each of the plurality of inner barrier walls WSI, but example embodiments are not limited thereto.

The insulation liner 132 may be conformally arranged to cover the inner walls of the isolation areas IA and a lateral surface of each of the plurality of light emitting device structures 120. The insulation liner 132 may be arranged on inner walls of grooves GR that penetrate through the active layer 124 and the second conductive type semiconductor layer 126. According to some example embodiments, the insulation liner 132 may include a silicon oxide, a silicon oxynitride, or a silicon nitride. According to some example embodiments, the insulation liner 132 may have a structure in which a plurality of insulating layers are stacked.

The first contacts 134A may be arranged to be connected to the first conductivity type semiconductor layer 122 within the grooves GR that penetrate through the active layer 124 and the second conductive type semiconductor layer 126. The second contacts 134B may be arranged on the lower surface of the second conductive type semiconductor layer 126. The insulation liner 132 may electrically insulate the first contacts 134A from the active layer 124 and the second conductive type semiconductor layer 126. The insulation liner 132 may be arranged between the first contacts 134A and the second contacts 134B on the lower surface of the second conductive type semiconductor layer 126, and may electrically insulate the first contacts 134A from the second contacts 134B.

Each of the first contacts 134A and the second contacts 134B may include Ag, Al, Ni, Cr, Au, Pt, Pd, Sn, W, Rh, Ir, Ru, Mg, Zn, Ti, Cu, or a combination thereof. The first contacts 134A and the second contacts 134B may include a metal material having high reflectivity.

Lower reflection layers 136 may be arranged on portions of the insulation liner 132 arranged on the inner walls of the isolation areas IA. The lower reflection layers 136 may reflect light emitted through the sidewalls of the plurality of light-emitting structures 120 to redirect the reflected light into the plurality of pixel spaces PXS.

According to some example embodiments, the lower reflection layers 136 may include Ag, Al, Ni, Cr, Au, Pt, Pd, Sn, W, Rh, Ir, Ru, Mg, Zn, Ti, Cu, or a combination thereof. The lower reflection layers 136 may include a metal material having high reflectivity. According to other example embodiments, each of the lower reflection layer 136 may be a distributed Bragg reflector. For example, the distributed Bragg reflector may have a structure in which a plurality of insulating layers having different refractive indexes are repeated and stacked. Each of the insulating layers included in the distributed Bragg reflector may include $SiO_2$, SiN, $SiO_xN_y$, $TiO_2$, $Si_3N_4$, $Al_2O_3$, TiN, AlN, $ZrO_2$, TiAlN, TiSiN, or the like.

The wiring structure 140 may be arranged on the insulation liner 132, the first contacts 134A, the second contacts 134B, and the lower reflection layers 136. The wiring structure 140 may include a plurality of insulating layers 142 and a plurality of wiring layers 144. The plurality of wiring layers 144 may electrically connect the first contacts 134A and the second contacts 134B to the pad portions PAD, respectively. Some of the plurality of wiring layers 144 may be arranged on the inner walls of the isolation areas IA, and the plurality of insulating layers 142 may cover the plurality of wiring layers 144, respectively, and may fill the isolation areas IA. The plurality of wiring layers 144 may include two or more wiring layers 144 arranged on different levels in the vertical direction, but example embodiments are not limited thereto. Each of the plurality of wiring layers 144 may include Ag, Al, Ni, Cr, Au, Pt, Pd, Sn, W, Rh, Ir, Ru, Mg, Zn, Ti, Cu, or a combination thereof.

According to some example embodiments, the plurality of light-emitting structures 120 included in one sub-array SA may be serially connected to each other, and the plurality of wiring layers 144 may electrically connect the first contact 134A of one light-emitting structure 120 to the second contact 134B of another light-emitting structure 120 serially connected thereto.

Pad portions PAD connected to the plurality of wiring layers 144 may be arranged on the pad region PDR, and the pad portions PAD may be arranged on a vertical level that is lower than the barrier wall structure WS. According to some example embodiments, the sidewalls and the lower surfaces of the pad portions PAD may be covered by the plurality of insulating layers 142, and the upper surfaces of the pad portions PAD may be arranged on a level that is lower than the upper surfaces of the plurality of light-emitting structures 120. According to other example embodiments, in contrast with the illustration, a portion of the plurality of light-emitting structures 120 may be arranged in the pad region PDR, and the pad portions PAD may be arranged within grooves formed in the plurality of light-emitting structures 120. In this case, the upper surfaces of the pad portions PAD may be arranged on the same level as the upper surfaces of the plurality of light-emitting structures 120. A connection member such as a bonding wire for electrical connection with the driving semiconductor chip 1200 of FIG. 18 may be arranged on the pad portions PAD.

The barrier wall structure WS may be arranged on the upper surfaces of at least some of the plurality of light-emitting structures 120. The barrier wall structure WS may include Si, silicon carbide (SiC), sapphire, or GaN. As will be described later, after the plurality of light-emitting structures 120 are formed on a substrate 110 of FIG. 8, the barrier wall structure WS may be formed by removing a portion of the substrate 110 of FIG. 8. In this case, the barrier wall structure WS may be a portion of the substrate 110 of FIG. 8 used as a growth substrate for forming the light-emitting structures 120.

In a plan view, the barrier wall structure WS may be arranged in a matrix form, and the plurality of pixel spaces PXS may be defined by the barrier wall structure WS. Recess areas RS may be formed by removing a portion of the substrate 110 of FIG. 8, in an etch process for dividing a light-emitting stack 120L of FIG. 8 into a plurality of light-emitting structures 120. The insulation liner 132 may be arranged to contact the recess areas RS, on the lower surface of the barrier wall structure WS. However, in the light-emitting device 100 according to an example embodiment, the barrier wall structure WS is not arranged on the isolation areas Lk of all of the light-emitting structures 120. For example, the fluorescent layers 160 other than the barrier wall structure WS may be arranged on at least some of the isolation areas IA. A detailed description thereof will be given later.

The upper surfaces of the plurality of light-emitting structures 120 may be exposed on lower portions of the plurality of pixel spaces PXS. For example, uneven portions 120P may be formed on the upper surfaces of the plurality of light-emitting structures 120 arranged on the lower portions of the plurality of pixel spaces PXS. The uneven portions 120P may improve light extraction efficiency from the plurality of light-emitting structures 120, but example embodiments are not limited thereto. For example, the upper surfaces of the plurality of light-emitting structures 120 may be formed as even portions instead of the uneven portions 120P.

A passivation structure 150 may be arranged on an upper surface WST and a sidewall WSS of each of a plurality of barrier wall structures WS. The passivation structure 150 may include a first passivation layer 152 and a second passivation layer 154 conformally arranged on the upper surface WST and the sidewall WSS of each of the plurality of barrier wall structures WS. The passivation structures 150 may also be conformally formed on the upper surfaces of the light-emitting structures 120 arranged on the lower portions of the plurality of pixel spaces PXS.

According to some example embodiments, the first passivation layer 152 may include a first insulating material, and the second passivation layer 154 may include a second insulating material that is different from the first insulating material. Each of the first insulating material and the second insulating material may include at least one of silicon oxide, silicon nitride, silicon oxynitride, aluminum oxide, and aluminum nitride.

According to some example embodiments, the passivation structure 150 may include a first portion 150P1 arranged on the upper surface WST of each of the plurality of barrier wall structures WS, a second portion 150P2 arranged on the sidewall WSS of each of the plurality of barrier wall structures WS, and a third portion 150P3 arranged on the upper surface of each of the plurality of light-emitting structures 120.

According to some example embodiments, a first thickness of the first portion 150P1 may be less than or equal to a second thickness of the second portion 150P2. A third thickness of the third portion 150P3 may be less than or equal to the second thickness of the second portion 150P2. For example, the first thickness of the first portion 150P1 may be about 0.1 μm to about 2 μm, the second thickness of the second portion 150P2 may be about 0.5 μm to about 5 μm, and the third thickness of the third portion 150P3 may be about 0.1 μm to about 2 μm.

According to some example embodiments, a portion of the first passivation layer 152 included in the first portion 150P1 may have a smaller thickness than a portion of the first passivation layer 152 included in the second portion 150P2. Similarly, a portion of the second passivation layer 154 included in the first portion 150P1 may have a smaller thickness than a portion of the second passivation layer 154 included in the second portion 150P2.

According to some example embodiments, the first passivation layer 152 may have a relatively uniform thickness on the sidewall WSS of each of the plurality of barrier wall structures WS. The second passivation layer 154 may also have a relatively uniform thickness on the sidewall WSS of each of the plurality of barrier wall structures WS. In a manufacturing process which will be described later, the first and second passivation layers 152 and 154 may include a material having good step coverage or may be formed using a manufacturing process favorable to form a material having good step coverage, for example, an atomic layer deposition (ALD) process.

According to some example embodiments, the first thickness may be less than a threshold thickness enabling the passivation structure 150 to act as a light guide. For example, when the first thickness of the first portion 150P1 of the passivation structure 150 arranged on the upper surfaces WST of each of the plurality of barrier wall structures WS is greater than the threshold thickness, light emitted from one pixel PX may be directed into an adjacent pixel PX through the first portion 150P1 of the passivation structure 150, and thus, when one pixel PX is turned on, light may be mixed into or permeate into an adjacent pixel PX. Accordingly, it may be difficult for the adjacent pixel PX to realize a completely off state. Because the first thickness of the first portion 150P1 may be less than or equal to the second thickness of the second portion 150P2, and, in particular, may be less than the threshold thickness, the second portion 150P2 of the passivation structure 150 may provide a sufficient thickness for preventing contamination of the fluorescent layer 160, and the first portion 150P1 may prevent a cross-talk of unwanted light between adjacent pixels PX.

A sidewall reflection layer may be arranged on the sidewall WSS of each of the plurality of barrier wall structures WS. The sidewall reflection layer may include a material having high reflectivity, such as a metal layer including Ag, Al, Ni, Cr, Au, Pt, Pd, Sn, W, Rh, Ir, Ru, Mg, Zn, or a combination thereof, and may reflect light emitted by the plurality of light-emitting structures 120. A protective layer may further be formed on the sidewall reflection layer.

The fluorescent layers 160 may be arranged on the upper surfaces of the plurality of light-emitting structures 120, within the plurality of pixel spaces PXS. As shown in FIG. 3, the fluorescent layers 160 may be arranged on the passivation structure 150 and fill the plurality of pixel spaces PXS. The upper surface of the fluorescent layers 160 may be arranged on the same level as the upper surfaces of the barrier wall structures WS, but example embodiments are not limited thereto.

According to some example embodiments, the fluorescent layers 160 may include a single type of material capable of converting the color of light emitted by the light-emitting structures 120 to a desired color, and fluorescent layers 160 related to the same color may be arranged within the plurality of pixel spaces PXS. According to other example embodiments, the colors of fluorescent layers 160 arranged in some of the plurality of pixel spaces PXS may be different from those of fluorescent layers 160 arranged in the remaining pixel spaces PXS.

The fluorescent layers 160 may include a first fluorescent layer 161 and a second fluorescent layer 162. The first fluorescent layer 161 may include resin having a phosphor dispersed therein, and the second fluorescent layer 162 may include a film containing a phosphor. For example, the second fluorescent layer 162 may include a phosphor in glass (PIG), which is a phosphor film in which phosphor particles are uniformly dispersed at a certain concentration. According to some example embodiments, the second fluorescent layer 162 may include a single crystal phosphor grown as a single crystal, a ceramic phosphor obtained by compression-sintering a phosphor itself, or a resin containing a phosphor.

The phosphor particles may be a wavelength conversion material for converting the wavelength of the light emitted from the plurality of light-emitting structures 120. In order to improve the density of phosphor particles and improve the color uniformity thereof, the first fluorescent layer 161 and the second fluorescent layer 162 may include two or more types of phosphor particles having different size distributions.

According to some example embodiments, the phosphor may have various compositions and colors, such as oxides, silicates, nitrides, and fluorides. For example, $\beta$-SiAlON: $Eu^{2+}$ (green), $(Ca, Sr)AlSiN_3:Eu^{2+}$ (red), $La_3Si_6N_{11}:Ce^{3+}$ (yellow), $K_2SiF_6:Mn_4^+$ (red), $SrLiAl_3N_4:Eu$(red), $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) (red), $K_2TiF_6:Mn_4^+$ (red), $NaYF_4:Mn_4^+$ (red), $NaGdF_4:Mn_4^+$ (red), or the like may be used as the phosphor. However, the type of the phosphor is not limited thereto.

According to other example embodiments, a wavelength conversion material such as quantum dots may be further arranged over each of the first fluorescent layer 161 and the second fluorescent layer 162. The quantum dots may have a core-shell structure by using a Groups III-V or II-VI elements-containing compound semiconductor, and may have a core such as CdSe or InP and a shell such as ZnS or ZnSe. Furthermore, the quantum dots may have a ligand for stabilization of the core and the shell.

A support substrate 170 may be arranged on the wiring structure 140, and an adhesive layer 172 may be arranged between the support substrate 170 and the wiring structure 140. According to some example embodiments, the adhesive layer 172 may include an electrically insulating material, for example, resins or polymer materials such as silicon oxides, silicon nitrides, or UV-curable materials. According to some example embodiments, the adhesive layer 172 may include an eutectic adhesive material such as AuSn or NiSi. The support substrate 170 may include, but is not limited to, a sapphire substrate, a glass substrate, a transparent conductive substrate, a Si substrate, a SiC substrate, or the like.

According to an example embodiment, the light-emitting pixel region PXR may include the first light-emitting pixel region PXR1 where the barrier wall structures WS are arranged, and the second light-emitting pixel region PXR2 where one or more barrier wall structures WS may be omitted.

In the first light-emitting pixel region PXR1, the plurality of light-emitting structures 120 may be separated from each other by the inner barrier walls WSI, and spaces defined by the inner barrier walls WSI may be filled with the first fluorescent layers 161. The plurality of light-emitting structures 120 arranged in the first light-emitting pixel region PXR1 and separated from each other by the inner barrier walls WSI may be referred to as first light-emitting structures. In the first light-emitting pixel region PXR1, the first fluorescent layers 161 have upper surfaces 161S that are convex, and the first fluorescent layers 161 having this shape may be obtained using a dispensing process.

In the second light-emitting pixel region PXR2, a plurality of light-emitting structures 120 may be integrated into one light-emitting structure by a barrier wall structure WS, and a space defined by the barrier wall structure WS may be filled with the second fluorescent layer 162. The plurality of light-emitting structures 120 arranged in the second light-emitting pixel region PXR2 and integrated into one light-emitting structure by the barrier wall structures WS may be referred to as second light-emitting structure. In the second light-emitting pixel region PXR2, the second fluorescent layer 162 has an upper surface 162S that is flat, and the second fluorescent layer 162 having this shape may be obtained by being formed as a PIG. According to some example embodiments, the second fluorescent layer 162 may include a single crystal phosphor, a ceramic phosphor, or a resin containing a phosphor.

The first light-emitting pixel region PXR1 and the second light-emitting pixel region PXR2 may be arranged in one light-emitting device 100, and an area occupied by the first light-emitting pixel region PXR1 may be larger than that occupied by the second light-emitting pixel region PXR2. In detail, the first light-emitting pixel region PXR1 may include a plurality of lines in the light-emitting device 100, and the second light-emitting pixel region PXR2 may include a single line in the light-emitting device 100.

In the first light-emitting pixel region PXR1, each pixel PX may correspond to each first fluorescent layer 161. In the second light-emitting pixel region PXR2, a plurality of pixels PX may be formed to share one second fluorescent layer 162. For example, in the first light-emitting pixel region PXR1, each first fluorescent layer 161 may be arranged over each of the plurality of light-emitting structures 120, and, in the second light-emitting pixel region PXR2, a single second fluorescent layer 162 may be arranged to extend over the plurality of light-emitting structures 120.

As such, by selectively providing the barrier wall structure WS within the light-emitting pixel region PXR, the first light-emitting pixel region PXR1 and the second light-emitting pixel region PXR2 may be adjusted to have different optical characteristics. For example, the first light-emitting pixel region PXR1 may realize relatively higher light brightness than the second light-emitting pixel region PXR2, by using the pixels PX separated from each other by the barrier wall structures WS and the first fluorescent layers 161 respectively corresponding to the pixels PX. The second light-emitting pixel region PXR2 may realize relatively higher optical uniformity than the first light-emitting pixel region PXR1, by using one pixel PX not separated by the barrier wall structure WS and a single second fluorescent layers 162 corresponding to the pixel PX.

In general, a light source module including a plurality of light-emitting device chips may be used for intelligent illumination systems such as head lamps for vehicles, and various illumination modes may be implemented according to surrounding conditions by individually controlling the light-emitting device chips. When a plurality of light-emitting devices arranged in a matrix configuration are used, light emitted by each of the plurality of light-emitting devices may be mixed into or permeate into an adjacent light-emitting device, and contrast characteristics of the light source module may not be good.

According to an example embodiment, formation of the barrier wall structure WS on at least some of the plurality of light-emitting structures 120 may reduce or prevent mixing and permeation of light emitted by a pixel PX into an adjacent pixel PX. In addition, the fluorescent layers 160 may be firmly fixed within the pixel spaces PXS by the barrier wall structures WS, and reliability of the light-emitting device 100 may be improved even under an environment where repetitive vibrations and impacts are applied, such as the light-emitting device 100 being used as a head lamp for vehicles.

Moreover, according to an example embodiment, the light-emitting pixel region PXR may include both the first light-emitting pixel region PXR1 having a relatively high light brightness and a second light-emitting pixel region PXR2 having a relatively high optical uniformity. Accordingly, in one light-emitting device 100, the first light-emitting pixel region PXR1 may correspond to a high-beam zone and the second light-emitting pixel region PXR2 may correspond to a low-beam zone, and thus optical characteristics required under different circumstances may be all provided with one light-emitting module.

Figure 5:
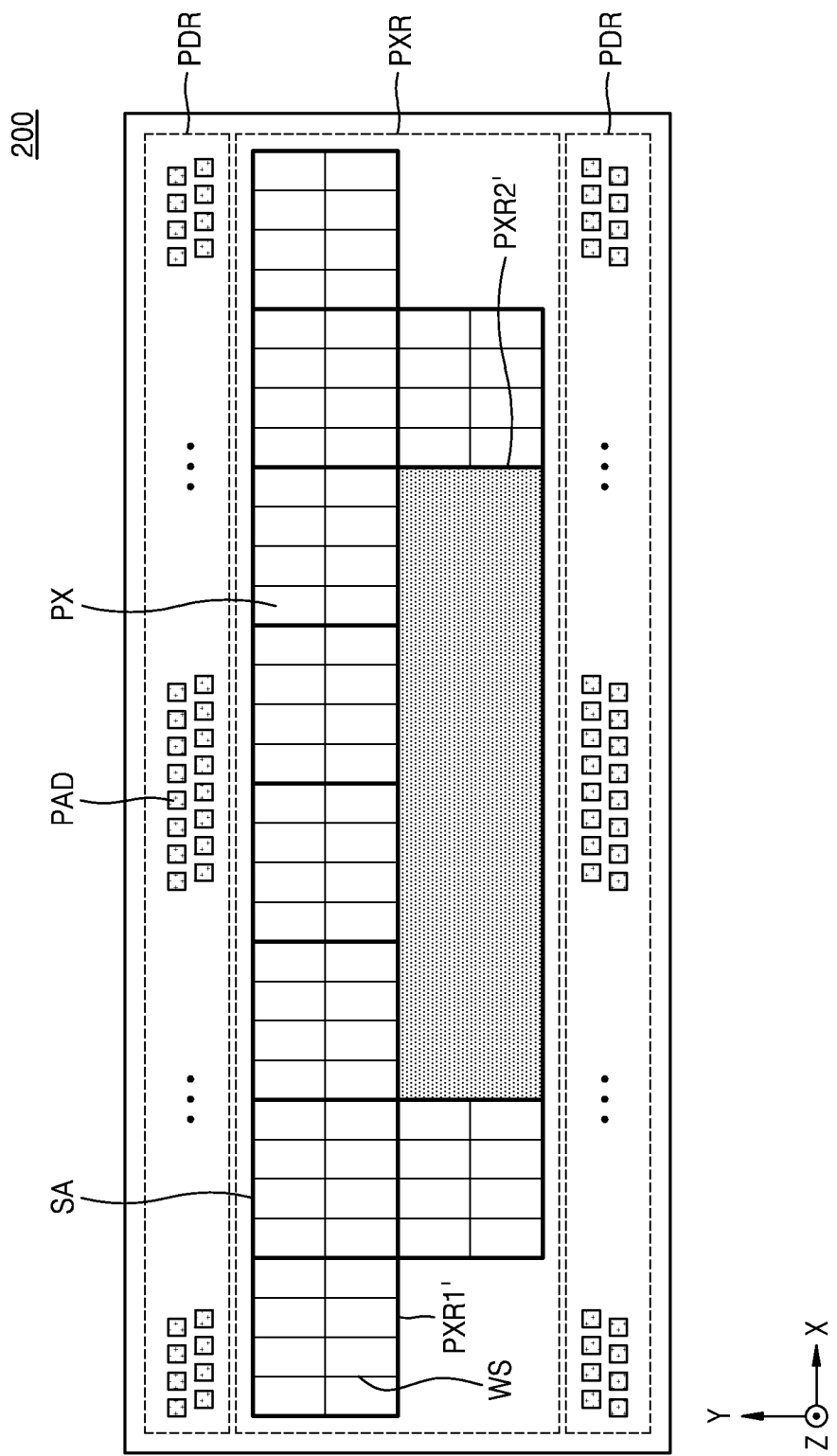
FIGS. 5 through 7 are plan views of light-emitting devices according to other example embodiments.
Figure 6:
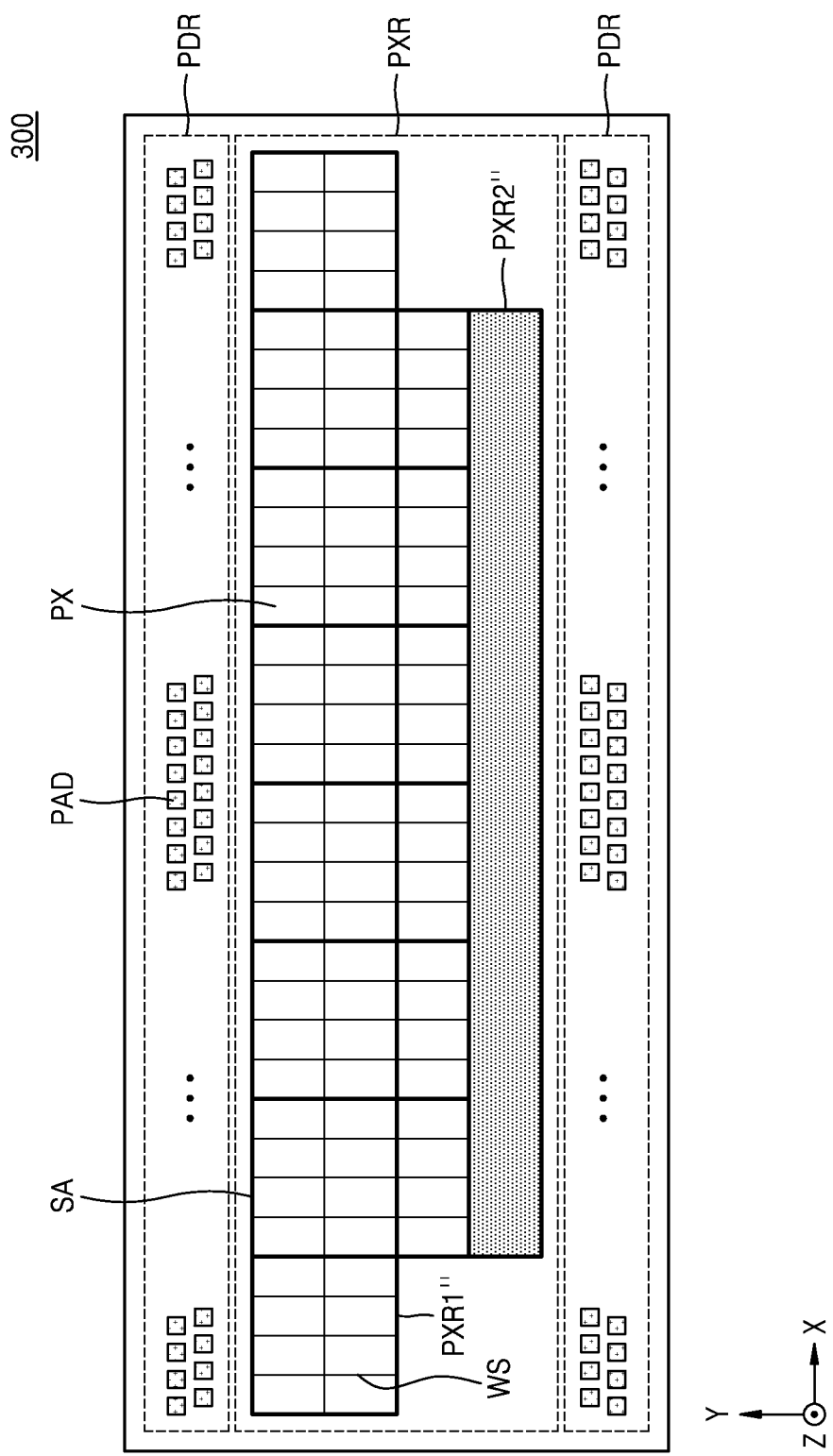
Figure 7:
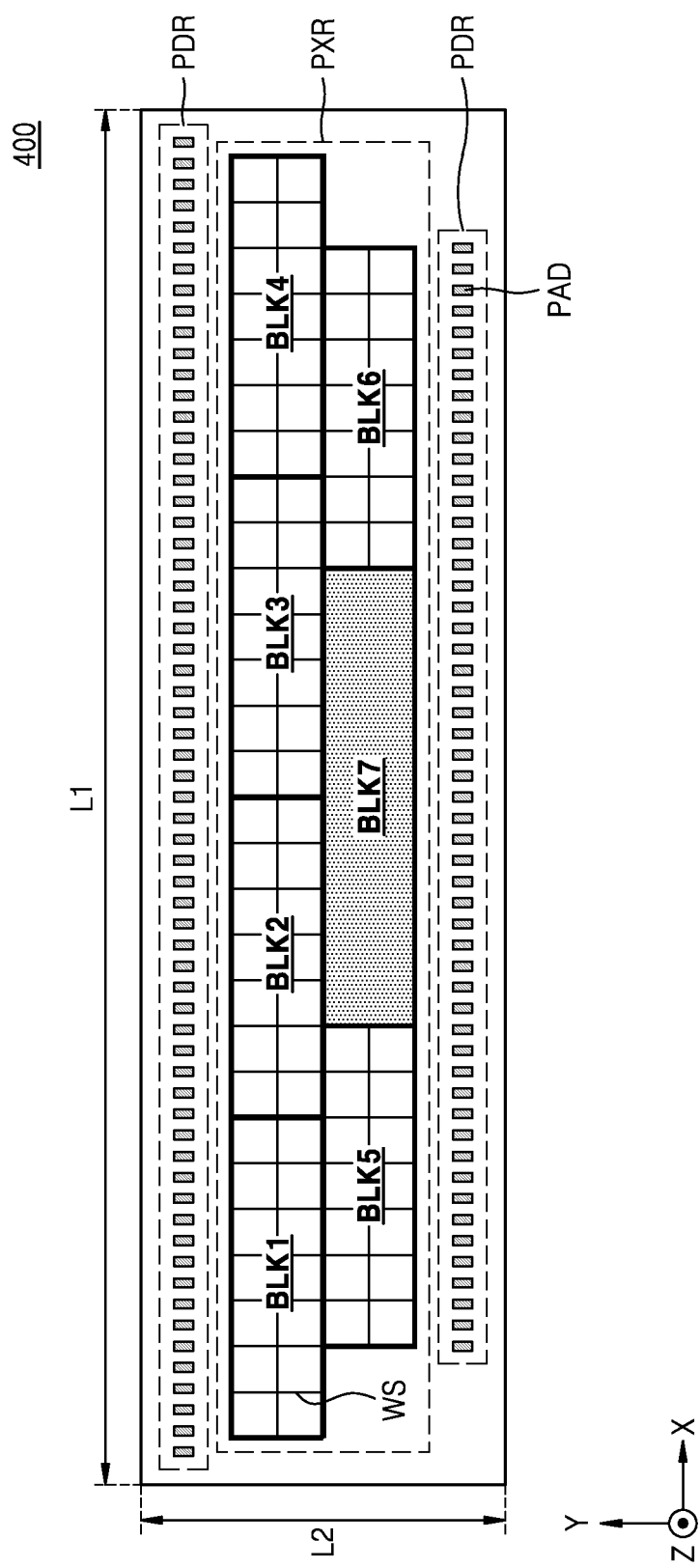

FIGS. 5 through 7 are plan views of light-emitting devices according to other example embodiments.

Most of the components constituting light-emitting devices 200, 300, and 400 to be described below and materials used to form the components are substantially the same as or similar to those described above with reference to FIGS. 1 through 4. Accordingly, for convenience of explanation, differences between the example embodiments of FIGS. 5 through 7 and the example embodiment of FIGS. 1 through 4 will be described with reference to the above-described light-emitting device 100 and the plan views.

Referring to FIG. 5, the light-emitting device 200 may include a light-emitting pixel region PXR and a pad region PDR arranged on at least one side of the light-emitting pixel region PXR.

According to an example embodiment, the light-emitting pixel region PXR may include a first light-emitting pixel region PXR1' where the barrier wall structures WS are arranged, and a second light-emitting pixel region PXR2' where one or more barrier wall structures WS may be omitted.

The first light-emitting pixel region PXR1' and the second light-emitting pixel region PXR2' may be arranged in the light-emitting device 200, and an area occupied by the first light-emitting pixel region PXR1' may be larger than that occupied by the second light-emitting pixel region PXR2'. In detail, the first light-emitting pixel region PXR1' may include a plurality of lines (e.g., rows) in the light-emitting device 200, and the second light-emitting pixel region PXR2' may include two lines in the light-emitting device 200. However, example embodiments are not limited thereto, and for example, the first light-emitting pixel region PXR1' may include more than five lines and the second light-emitting pixel region PXR2' may include more than three lines.

In a plan view, three sides of the second light-emitting pixel region PXR2' may be arranged to contact the first light-emitting pixel region PXR1'.

Referring to FIG. 6, the light-emitting device 300 may include a light-emitting pixel region PXR and a pad region PDR arranged on at least one side of the light-emitting pixel region PXR.

According to an example embodiment, the light-emitting pixel region PXR may include a first light-emitting pixel region PXR1" where the barrier wall structures WS are arranged, and a second light-emitting pixel region PXR2" where one or more barrier wall structures WS may be omitted.

The first light-emitting pixel region PXR1" and the second light-emitting pixel region PXR2" may be arranged in the light-emitting device 300, and an area occupied by the first light-emitting pixel region PXR1" may be larger than that occupied by the second light-emitting pixel region PXR2". In detail, the first light-emitting pixel region PXR1" may include three lines in the light-emitting device 300, and the second light-emitting pixel region PXR2" may include one line in the light-emitting device 300. However, example embodiments are not limited thereto, and for example, the first light-emitting pixel region PXR1" may include more than four lines and the second light-emitting pixel region PXR2" may include more than two lines.

In a plan view, only one side of the second light-emitting pixel region PXR2" may be arranged to contact the first light-emitting pixel region PXR1".

Referring to FIG. 7, the light-emitting device 400 may include a plurality of cell blocks BLK1 through BLK7, and the number of light-emitting cells included in a specific cell block BLK7 from among the plurality of cell blocks BLK1 through BLK7 may be different from the number of light-emitting cells included in the other cell blocks BLK1 through BLK6.

The light-emitting device 400 may include a specific cell block BLK7 arranged in a center lower portion of the light-emitting pixel region PXR and including a relatively large number of light-emitting cells compared to the other cell blocks BLK1 through BLK6. For example, when the light-emitting device 400 is provided in a light source module of a head lamp for vehicles, the light source module needs to radiate relatively weak light to a center lower portion of a user's front in a direction where the user travels. Thus, the light source module may apply a relatively low current to the specific cell block BLK7 arranged in the center lower portion of the light-emitting pixel region PXR. The specific cell block BLK7 arranged in the center lower portion of the pixel region PXR includes a relatively large number of light-emitting cells, but a relatively low current is applied to the specific cell block BLK7, and thus light brightness in the specific cell block BLK7 may be lowered.

The plurality of cell blocks BLK1 through BLK7 may be arranged in a total of two rows, namely, a lower row and an upper row, and light-emitting cells arranged in the specific cell block BLK7 on the lower row may be simultaneously driven. Because no barrier wall structures WS are formed between the light-emitting cells arranged within the specific cell block BLK7 on the lower row, optical uniformity in the specific cell block BLK7 may be increased.

In a plan view, the light-emitting device 400 may have an approximately rectangular shape. For example, a width L1 of the light-emitting device 400 in the X direction may be about 1.1 or more times a width L2 of the light-emitting device 400 in the Y direction, or may be about 100 or less times the width L2 of the light-emitting device 400 in the Y direction. A thickness of the light-emitting device 400 (length in a Z direction) may be several tens μm to several hundreds μm, and may be about 1/10 or less times the width L1 in the X direction. The light-emitting device 400 may have a dimension where resistance to physical stress is optimized, and bending of the light-emitting device 400 may be minimized.

FIGS. 8 through 12, 13A, 13B, 14A, 14B, 15A, 15B, 16 and 17 are cross-sectional views illustrating a method of fabricating a light-emitting device, according to an example embodiment.

The method of fabricating the light-emitting device will now be described with reference to cross-sectional views taken along line III-III 'and IV-IV'.

Figure 8:
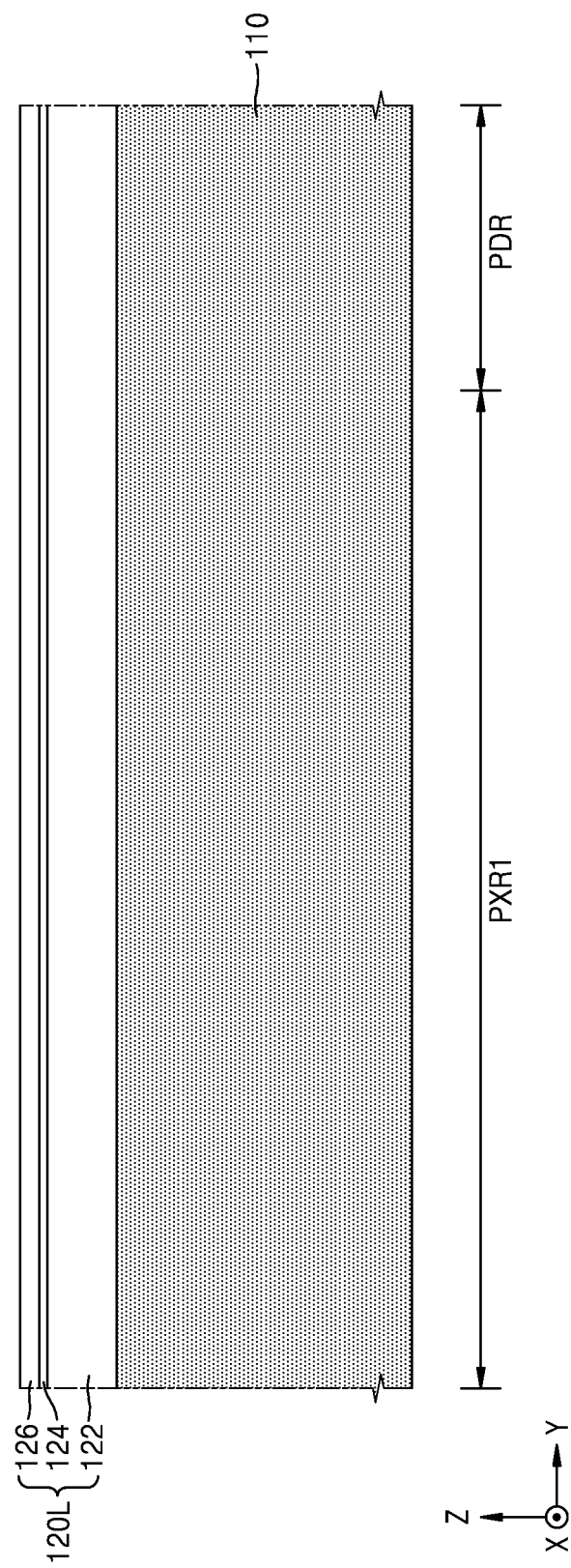
FIGS. 8 through 12, 13A, 13B, 14A, 14B, 15A, 15B, 16 and 17 are cross-sectional views illustrating a method of fabricating a light-emitting device, according to an example embodiment.

Referring to FIG. 8, the light-emitting stack 120L may be formed on one surface of the substrate 110.

The substrate 110 may include a Si substrate, a SiC substrate, a sapphire substrate, or a GaN substrate. The substrate 110 may include a pixel region PXR and a pad region PDR. In a plan view, the pad region PDR may be arrange on at least one side of the pixel region PXR.

The light-emitting stack 120L may include a first conductive type semiconductor layer 122, an active layer 124, and a second conductive type semiconductor layer 126 that are sequentially disposed on one side of the substrate 110.

Figure 9:
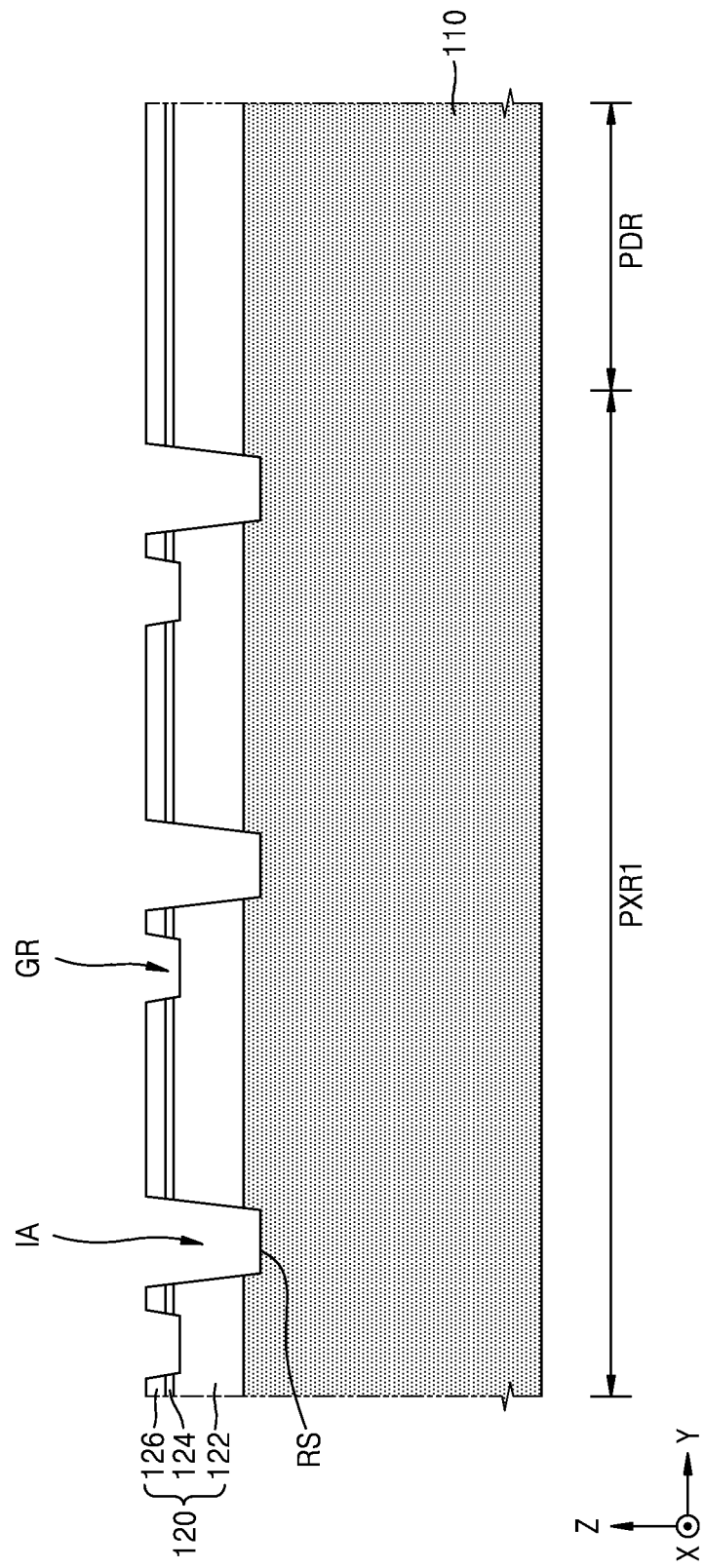

Referring to FIG. 9, grooves GR may be formed by forming an etch mask pattern on the light-emitting stack 120L and etching a portion of the light-emitting stack 120L.

The grooves GR may expose an upper surface of the first conductive type semiconductor layer 122. No grooves GR may be formed in the pad region PDR of the substrate 110. Isolation areas IA may also be formed by etching a portion of the light-emitting stack 120L by using the etch mask pattern. A plurality of light-emitting structures 120 may be formed to be spaced apart from each other by the isolation areas IA.

According to some example embodiments, a process of forming the isolation areas IA may be performed using a blade, but example embodiments are not limited thereto. As shown in FIG. 9, lateral cross-sections of the plurality of light-emitting structures 120 obtained according to the process of forming the isolation areas IA may each have a trapezoidal shape where an upper portion is wider than a lower portion, but example embodiments are not limited thereto. In the process of forming the isolation areas IA, a portion of the substrate 110 may also be removed and thus recess areas RS may be formed in the substrate 110.

Figure 10:
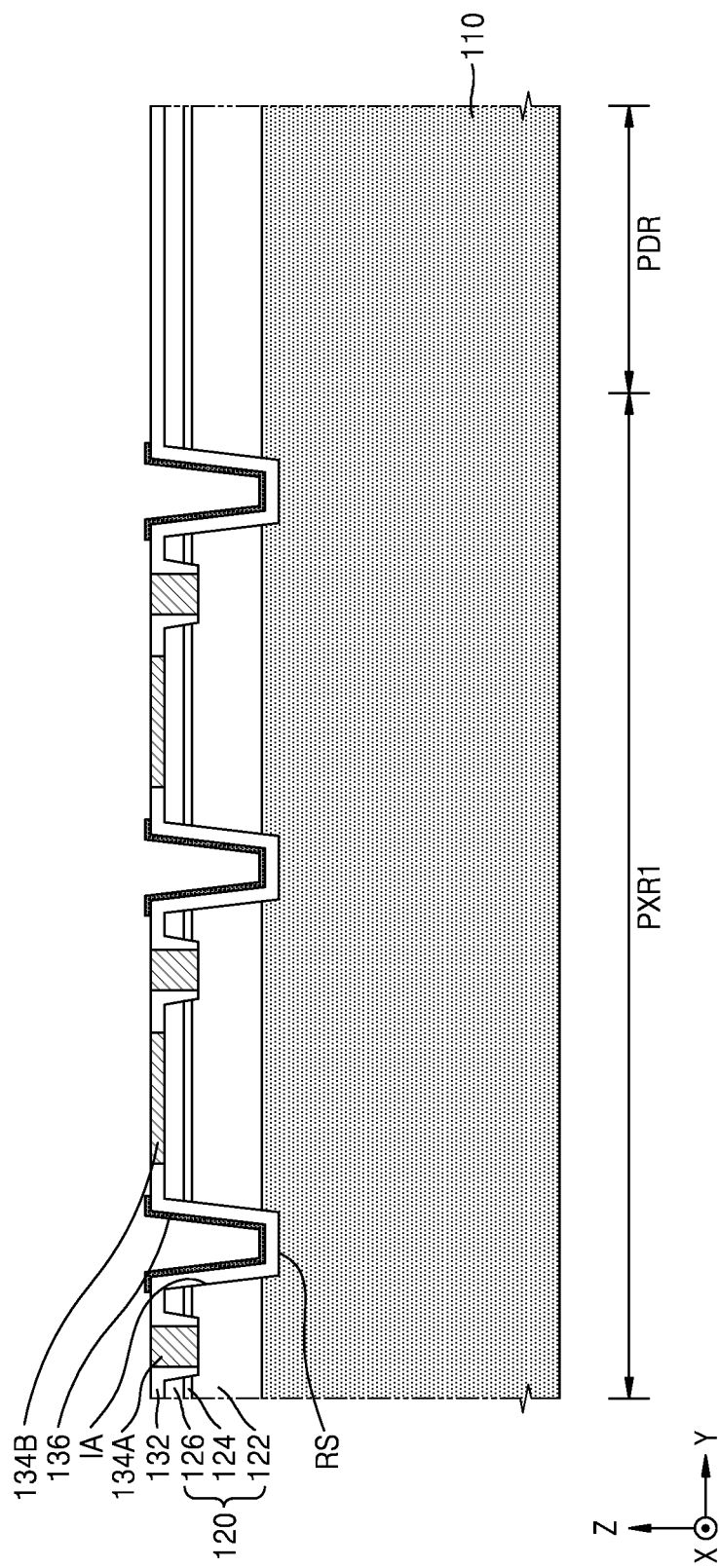

Referring to FIG. 10, an insulation liner 132 conformally covering the plurality of light-emitting structures 120 may be formed.

The upper surface of the first conductive type semiconductor layer 122 may be exposed by removing a portion of the insulation liner 132 from the grooves GR, and the first contact 134A may be formed on each of the exposed portions of the upper surface of the first conductive type semiconductor layer 122. According to some example embodiments, an ohmic metal layer may be further formed of a conductive ohmic material on the upper surface of the first conductive type semiconductor layer 122 before the first contacts 134A are formed.

The upper surface of the second conductive type semiconductor layer 126 may be exposed by removing a portion of the insulation liner 132, and the second contact 134B may be formed on each of the exposed portions of the upper surface of the second conductive type semiconductor layer 126. According to some example embodiments, an ohmic metal layer may be further formed of a conductive ohmic material on the upper surface of the second conductive type semiconductor layer 126 before the second contacts 134B are formed.

The lower reflection layers 136 may be formed on the insulation liner 132 along the inner walls of the isolation areas IA, respectively. Alternatively, the lower reflection layers 136 may be formed simultaneously with the forming of the first contacts 134A, or may be formed simultaneously with the forming of the second contacts 134B.

Figure 11:
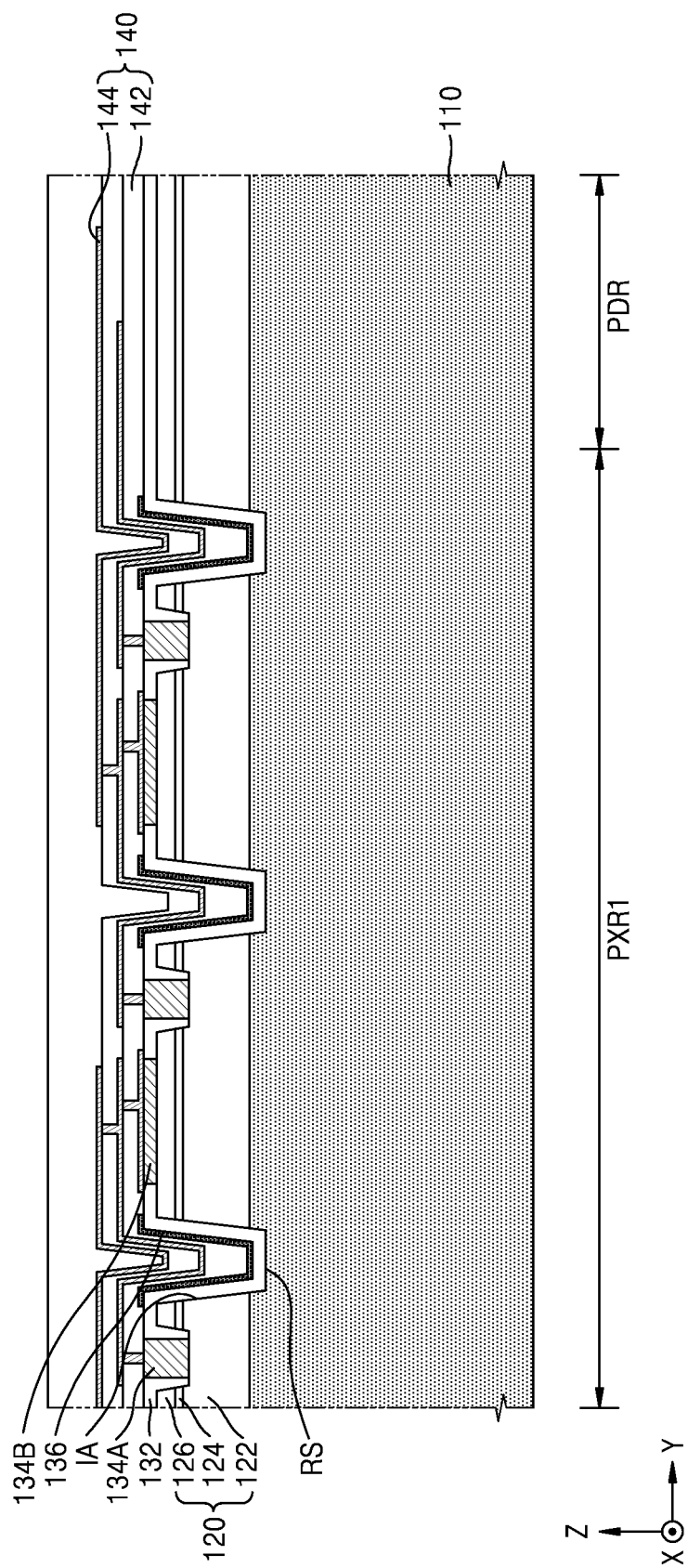

Referring to FIG. 11, the wiring structure 140 may be formed on the insulation liner 132, the first contacts 134A, the second contacts 134B, and the lower reflection layers 136.

A process of forming a conductive layer on the insulation liner 132, the first contacts 134A, the second contacts 134B, and the lower reflection layers 136, patterning the conductive layer to form the wiring layers 144, and forming the insulating layers 142 covering the wiring layers 144 is repeated. Accordingly, the wiring structure 140 including a plurality of wiring layers 144 and a plurality of insulating layers 142 may be formed. According to some example embodiments, at least a portion of the plurality of wiring layers 144 may be formed by plating.

Figure 12:
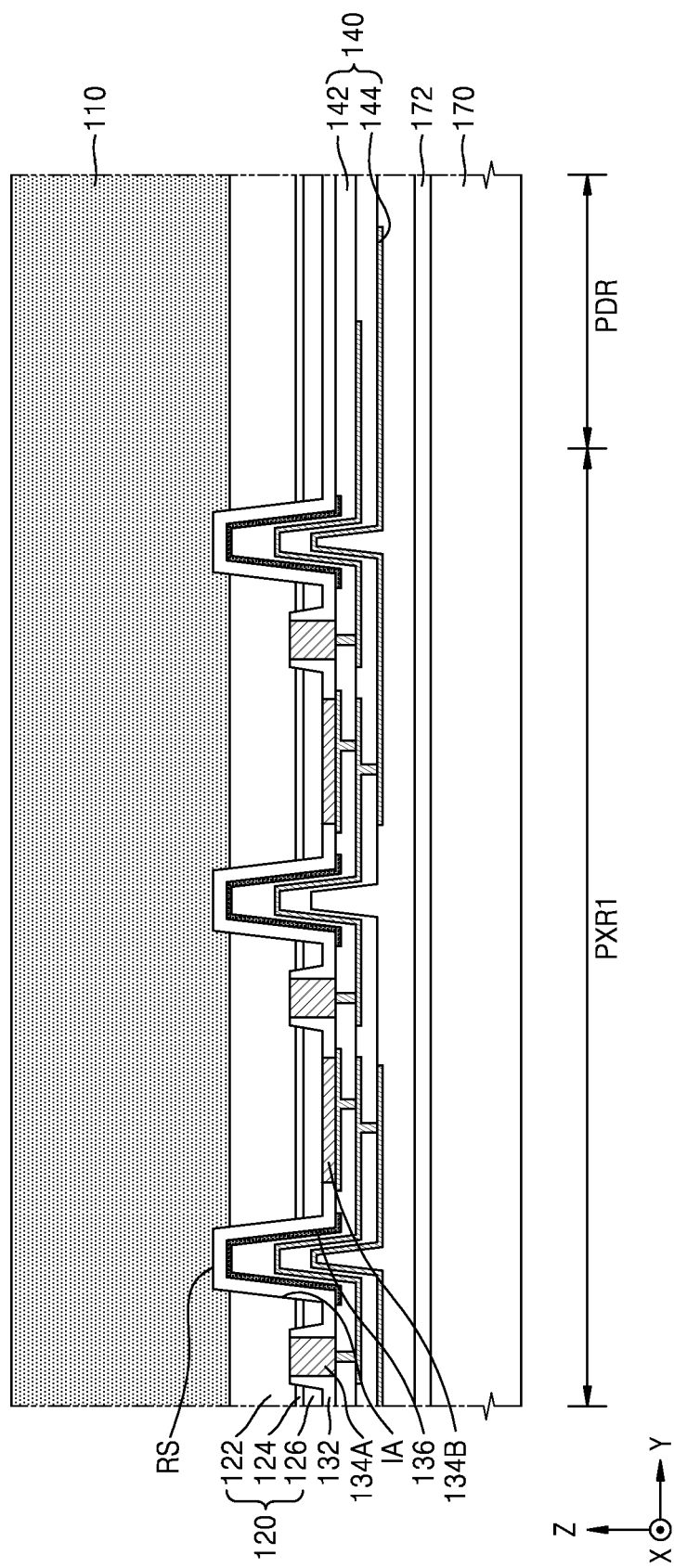

Referring to FIG. 12, the adhesive layer 172 may be formed on the wiring structure 140, and the support substrate 170 may be attached onto the adhesive layer 172.

The light-emitting structures 120 attached to the support substrate 170 may be turned upside down (i.e., inverted) such that another surface opposite to one surface of the substrate 110 that contacts the light-emitting structures 120 faces upside. Next, a certain thickness of the substrate 110 from the other surface may be removed by grinding or full etching.

Figure 13A:
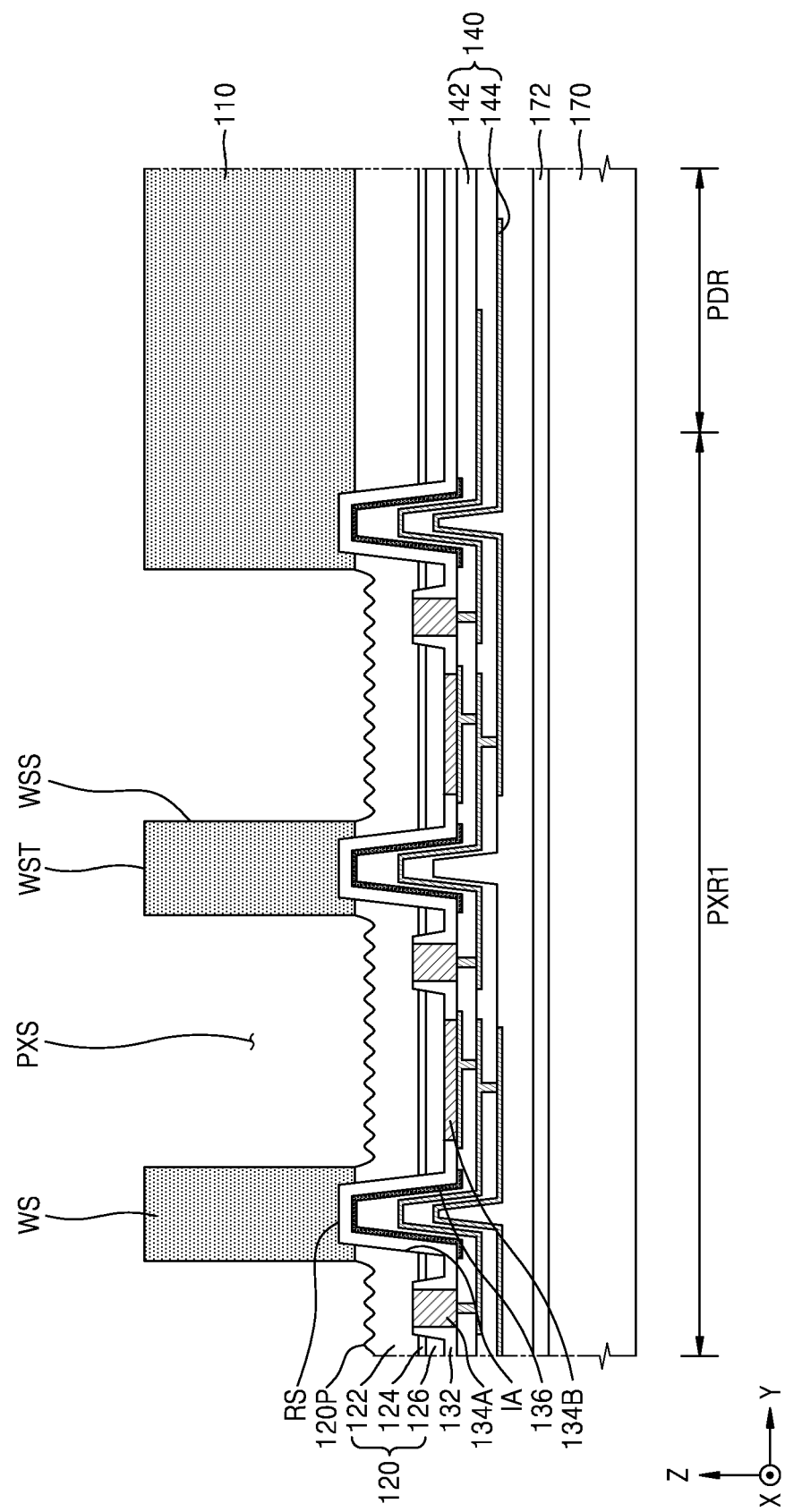
Figure 13B:
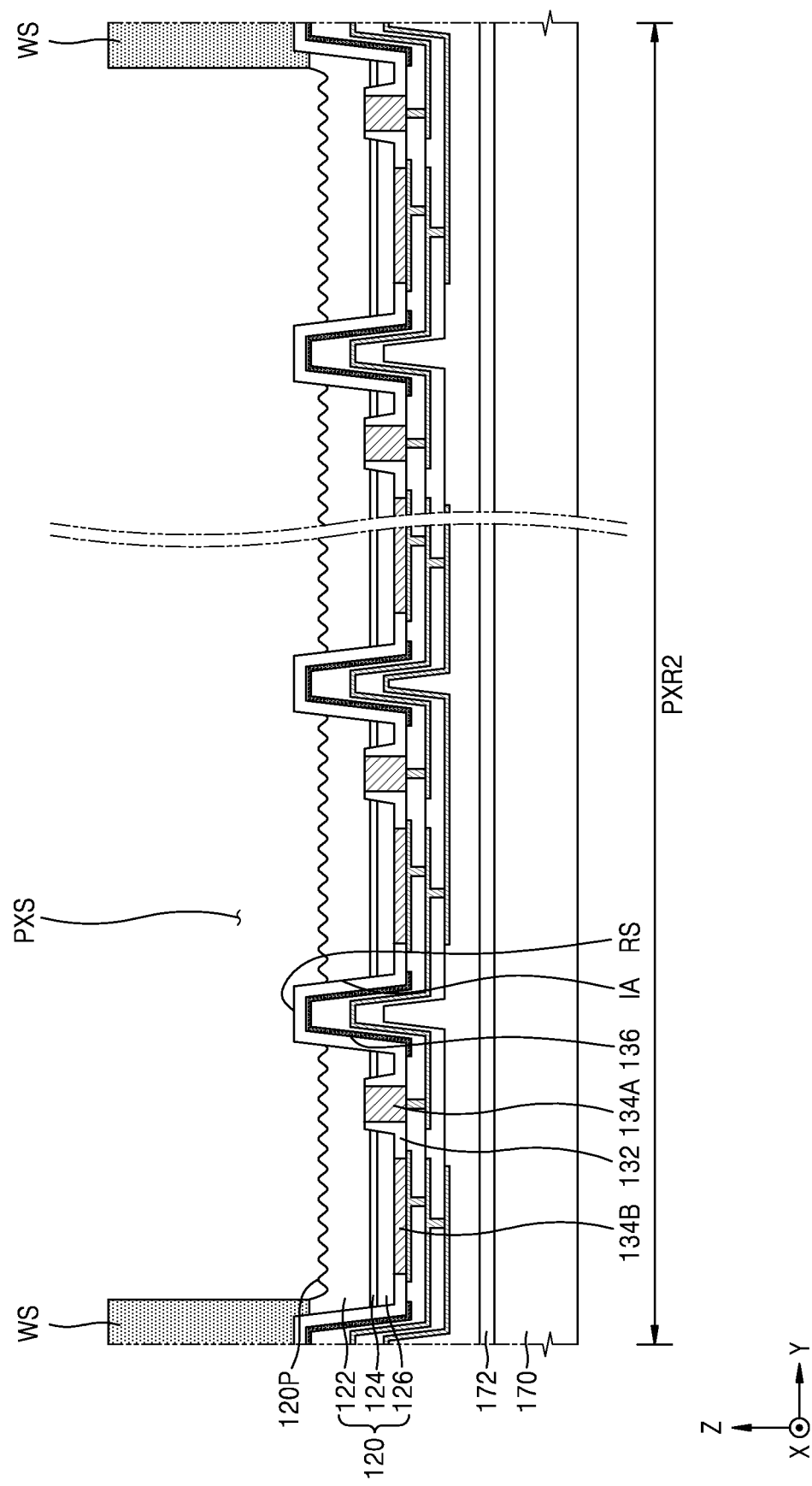

Referring to FIGS. 13A and 13B, by forming an etch mask pattern on the substrate 110 and etching a portion of the substrate 110, a plurality of pixel spaces PXS may be formed in the first light-emitting pixel region PXR1 of the substrate 110, and a single pixel space PXS may be formed in the second light-emitting pixel region PXR2 of the substrate 110.

A portion of the substrate 110 between the plurality of pixel spaces PXS in the first light-emitting pixel region PXR1 may be referred to as barrier wall structures WS. The barrier wall structures WS may be arranged to vertically overlap the isolation areas IA, and the plurality of light-emitting structures 120 may be arranged within the plurality of pixel spaces PXS, respectively. The upper surface of the first conductive type semiconductor layer 122, namely, the upper surfaces of the plurality of light-emitting structures 120, may be exposed below the plurality of pixel spaces PXS.

In contrast, the substrate 110 arranged within the single pixel space PXS in the second light-emitting pixel region PXR2 may be entirely removed except for an outer portion of the substrate 110. A plurality of light-emitting structures 120 may be arranged within the single pixel space PXS such that the upper surfaces of the isolation areas IA are exposed. The upper surface of the first conductive type semiconductor layer 122, namely, the upper surfaces of the plurality of light-emitting structures 120, may be exposed below the single pixel space PXS.

In the first light-emitting pixel region PXR1 and the second light-emitting pixel region PXR2, the uneven portions 120P may be formed by performing an etch process on the first conductive type semiconductor layer 122 exposed below the pixel space PXS. Alternatively, the etch process for forming the uneven portions 120P may be omitted.

Figure 14A:
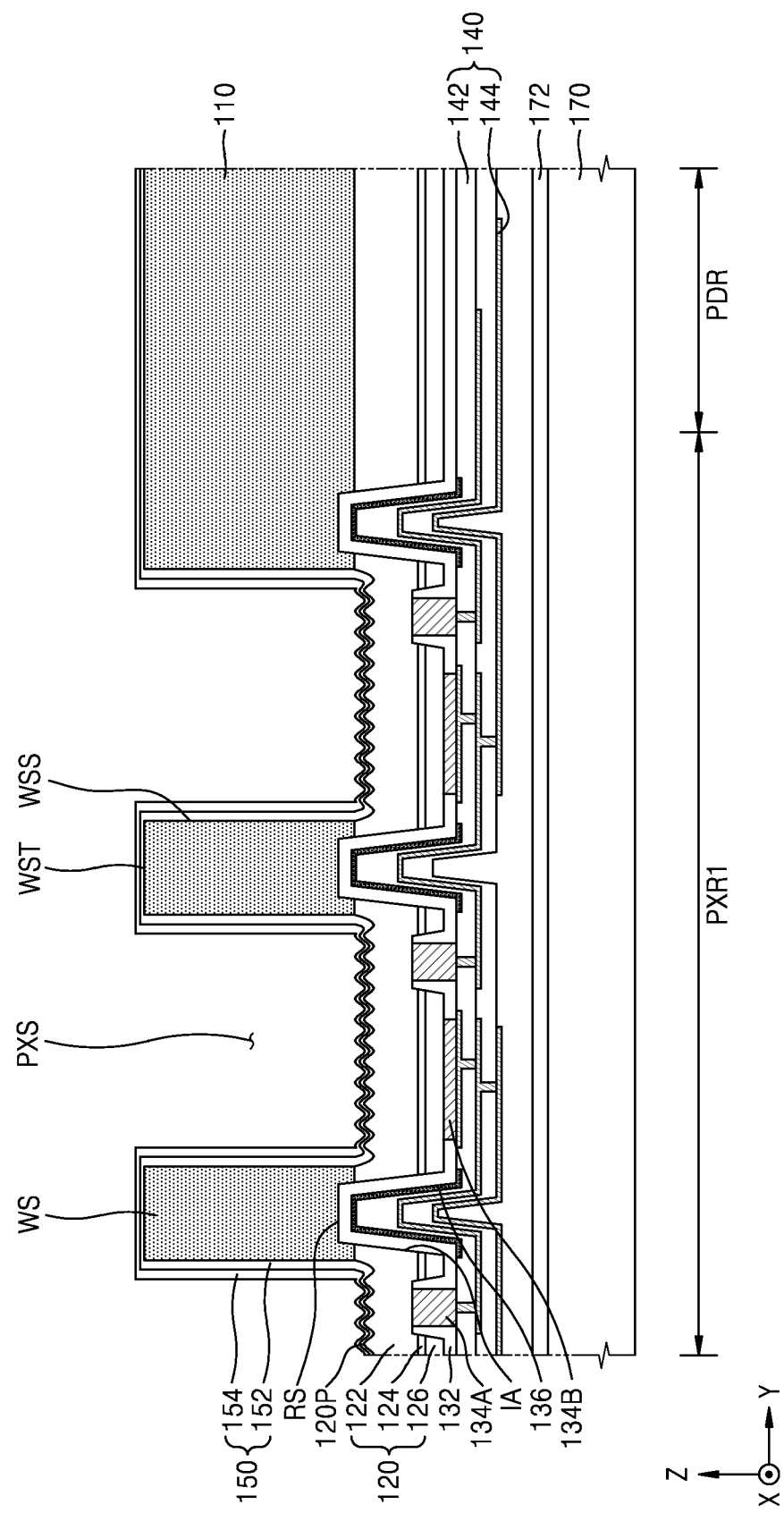
Figure 14B:
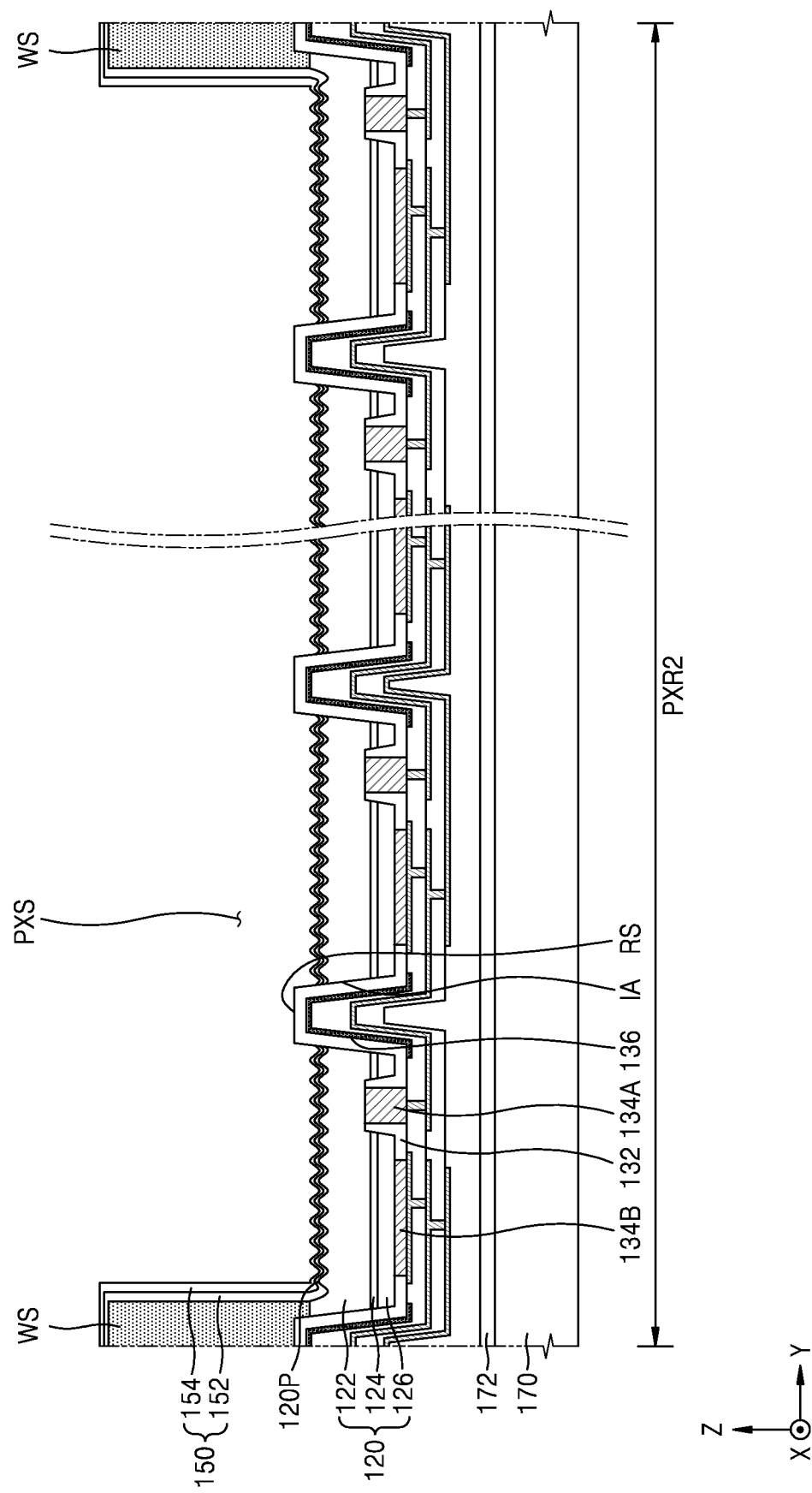

Referring to FIGS. 14A and 14B, the passivation structure 150 may be formed on the barrier wall structures WS and the substrate 110.

The passivation structure 150 may be formed on the upper surfaces WST and the sidewalls WSS of the barrier wall structures WS, and also on the upper surfaces of the plurality of light-emitting structures 120. The passivation structure 150 may include the first passivation layer 152 and the second passivation layer 154.

According to some example embodiments, each of the first passivation layer 152 and the second passivation layer 154 may be formed of a first insulative material that is at least one of silicon oxide, silicon nitride, silicon oxynitride, aluminum oxide, and aluminum nitride. Each of the first passivation layer 152 and the second passivation layer 154 may be formed by ALD, chemical vapor deposition, or the like.

Figure 15A:
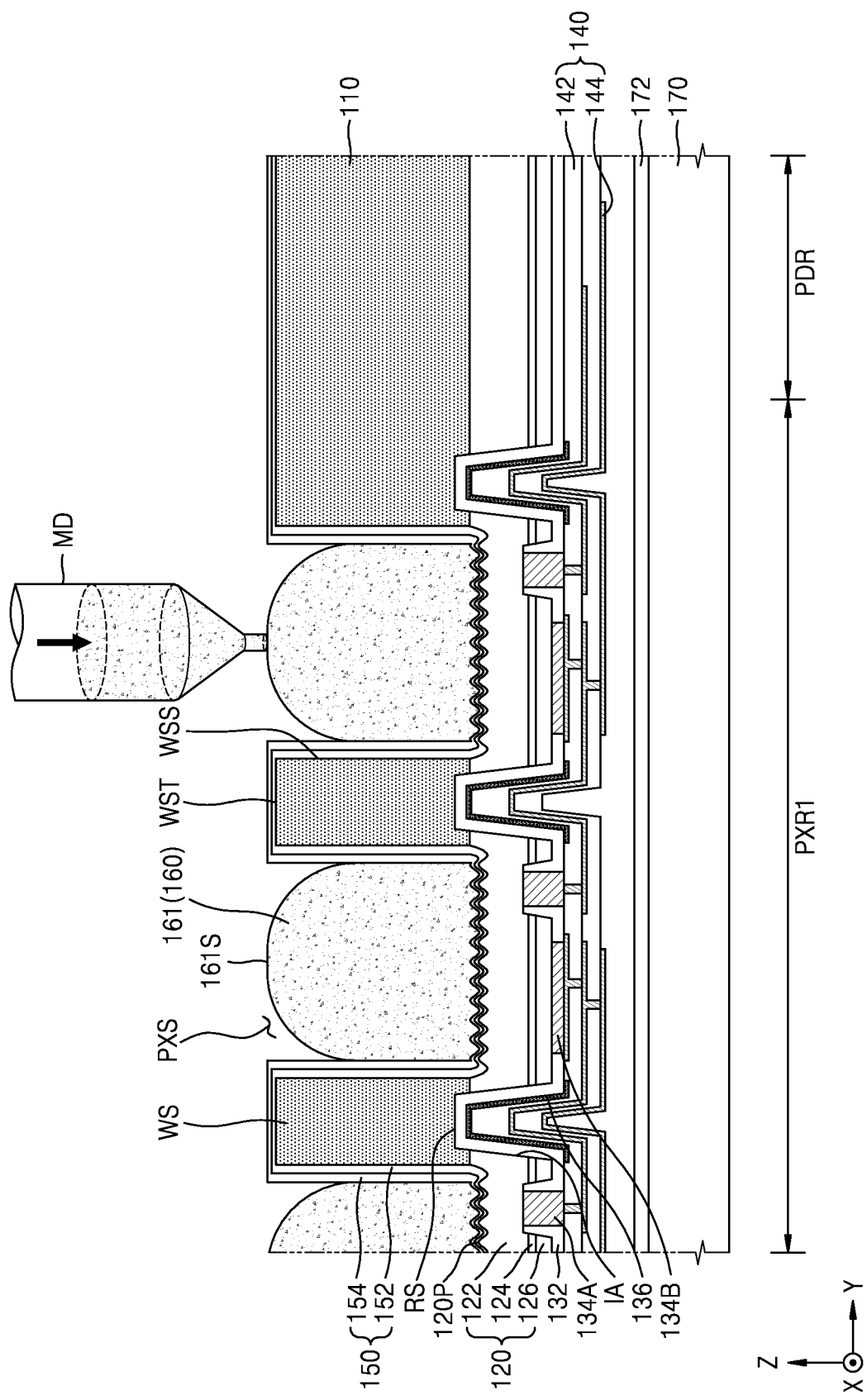
Figure 15B:
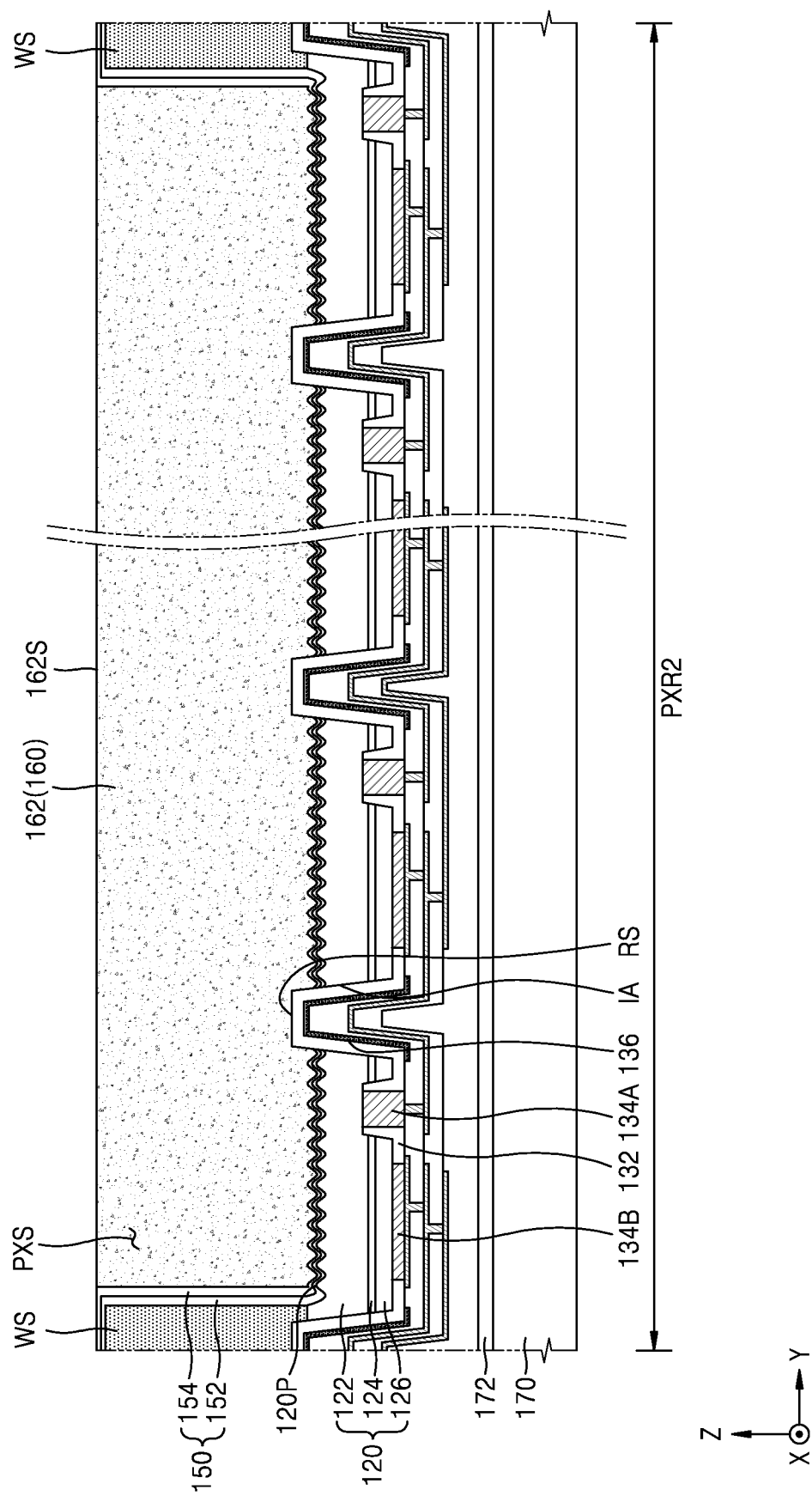

Referring to FIGS. 15A and 15B, the fluorescent layers 160 provided in (i.e. filling) the plurality of pixel spaces PXS may be formed.

In the first light-emitting pixel region PXR1, the first fluorescent layers 161 may be formed within the plurality of pixel spaces PXS by using a dispensing process of coating a resin having phosphor particles dispersed therein. For example, the plurality of pixel spaces PXS may be filled with the resin having phosphor particles dispersed therein, by using micro dispensing equipment (MD).

In the first light-emitting pixel region PXR1, the plurality of light-emitting structures 120 may be separated from each other by the barrier wall structures WS, and spaces defined by the barrier wall structures WS may be filled with the first fluorescent layers 161. In the first light-emitting pixel region PXR1, the first fluorescent layers 161 have upper surfaces 161S that are convex, and the first fluorescent layers 161 having this shape may be obtained using a dispensing process.

In the second light-emitting pixel region PXR2, the second fluorescent layer 162 may be formed within the single pixel space PXS by using a process of attaching a PIG, which is a phosphor film in which phosphor particles are uniformly dispersed at a certain concentration. According to some example embodiments, the second fluorescent layer 162 may be formed using a single crystal phosphor grown as a single crystal, a ceramic phosphor obtained by compression-sintering a phosphor itself, or a resin containing a phosphor.

In the second light-emitting pixel region PXR2, the plurality of light-emitting structures 120 may be integrated into one light-emitting structure by a portion of the substrate 110, and a space defined by the portion of the substrate 110 may be filled with the second fluorescent layer 162. In the second light-emitting pixel region PXR2, the second fluorescent layer 162 has an upper surface 162S that is flat, and the second fluorescent layer 162 having this shape may be obtained by being formed as a PIG. According to some example embodiments, the second fluorescent layer 162 may include a single crystal phosphor, a ceramic phosphor, or a resin containing a phosphor.

Figure 16:
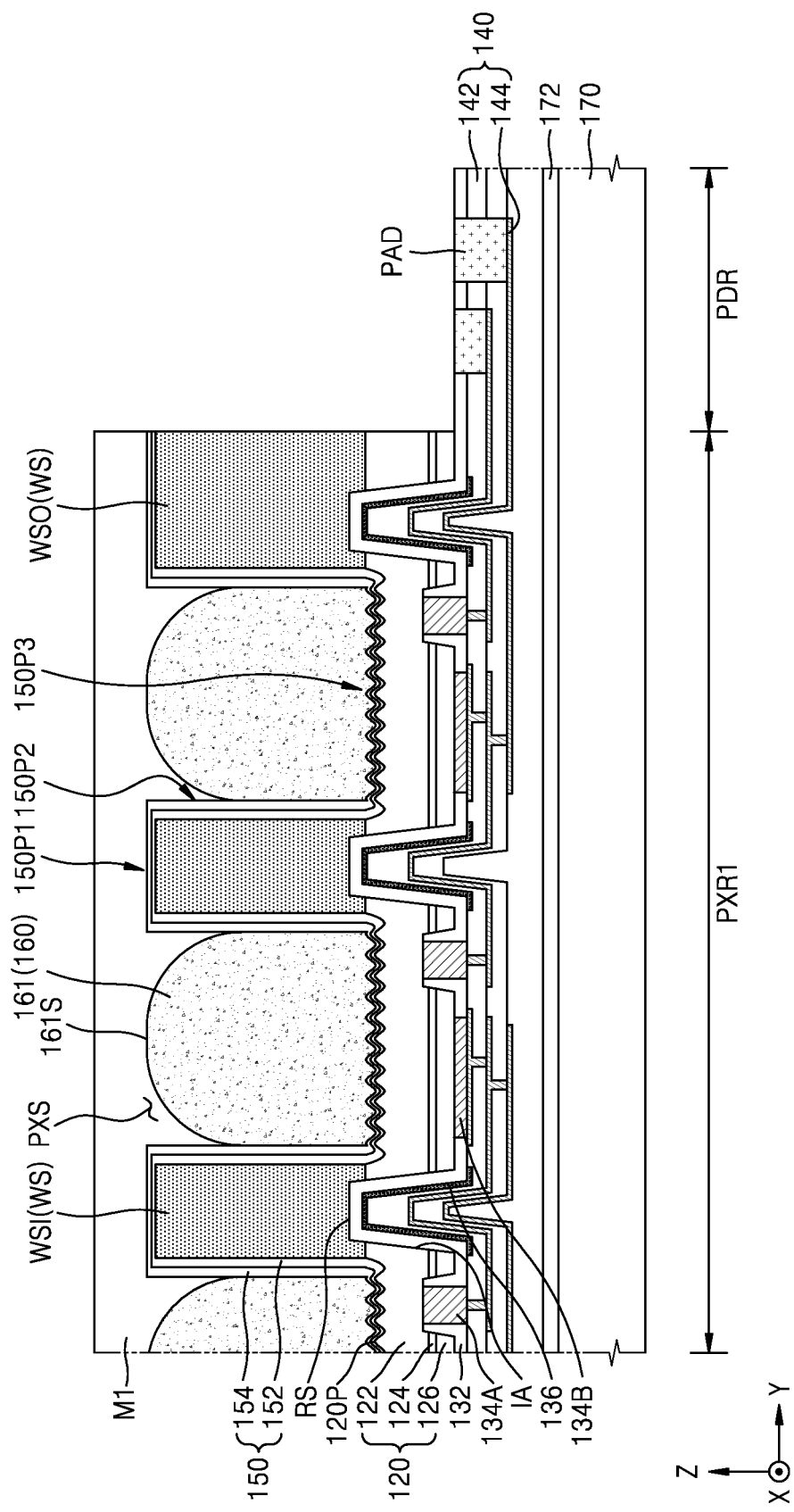

Referring to FIG. 16, a mask pattern M1 covering the fluorescent layers 160 and the plurality of inner barrier walls WSI may be formed in the pixel region PXR, and the outer barrier wall WSO may be formed by removing an outermost portion of the substrate 110 by using the mask pattern M1 as an etch mask.

The wiring structure 140 may be exposed by removing a portion of the light-emitting stack 120L exposed outside the outer barrier wall WSO. The pad portions PAD may be formed by forming grooves in the wiring structure 140 and filling the grooves with a conductive material.

Figure 17:
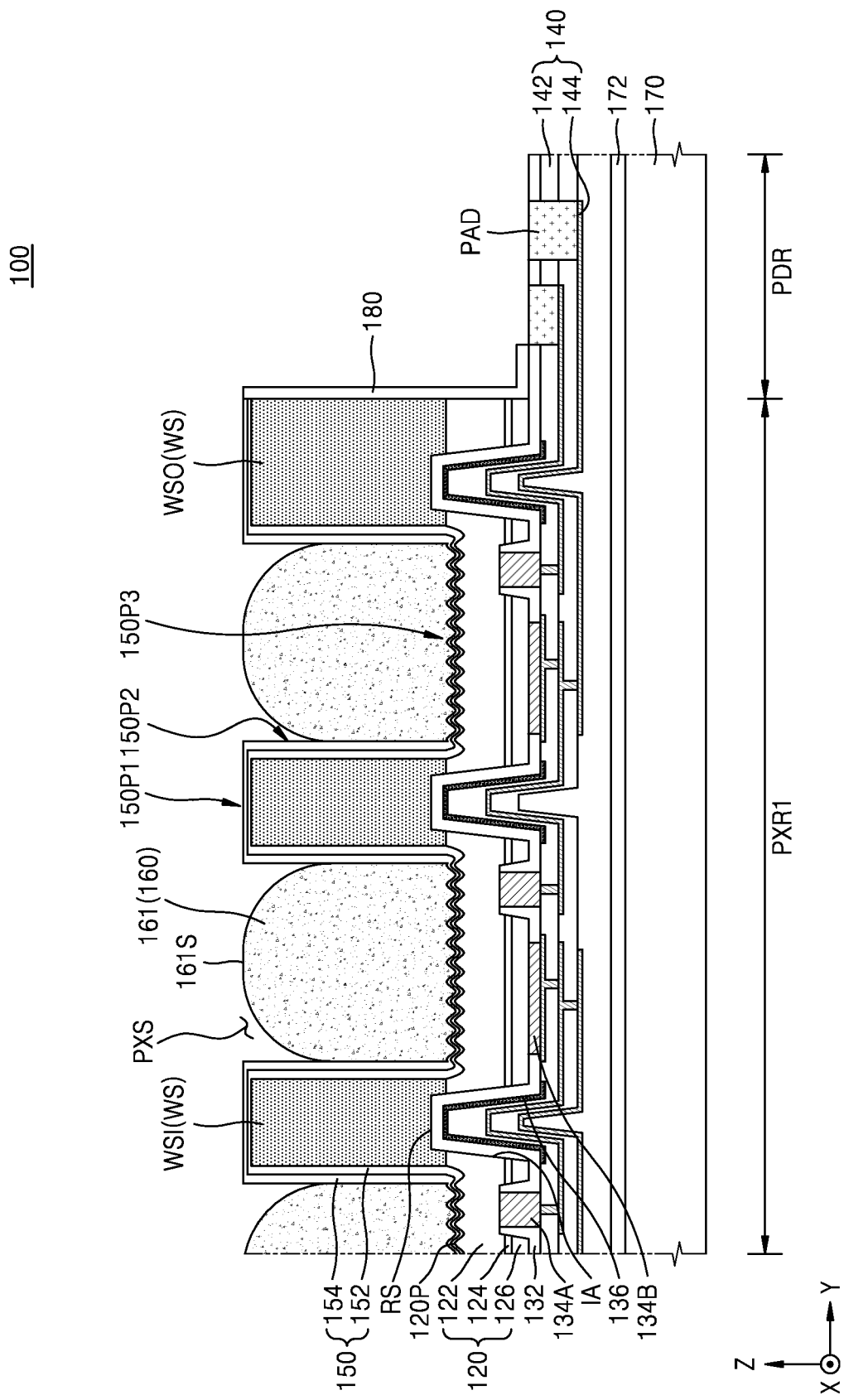

Referring to FIG. 17, the mask pattern M1 of FIG. 16 may be removed by ashing and stripping.

An edge protective layer 180 may be formed using an insulative material on the outer sidewall of the outer barrier wall WSO. The edge protective layer 180 may cover the entirety or a portion of the upper surfaces of the pad portions PAD.

As such, according to the above-described process, the light-emitting device 100 according to an example embodiment may be completed.

Figure 18:
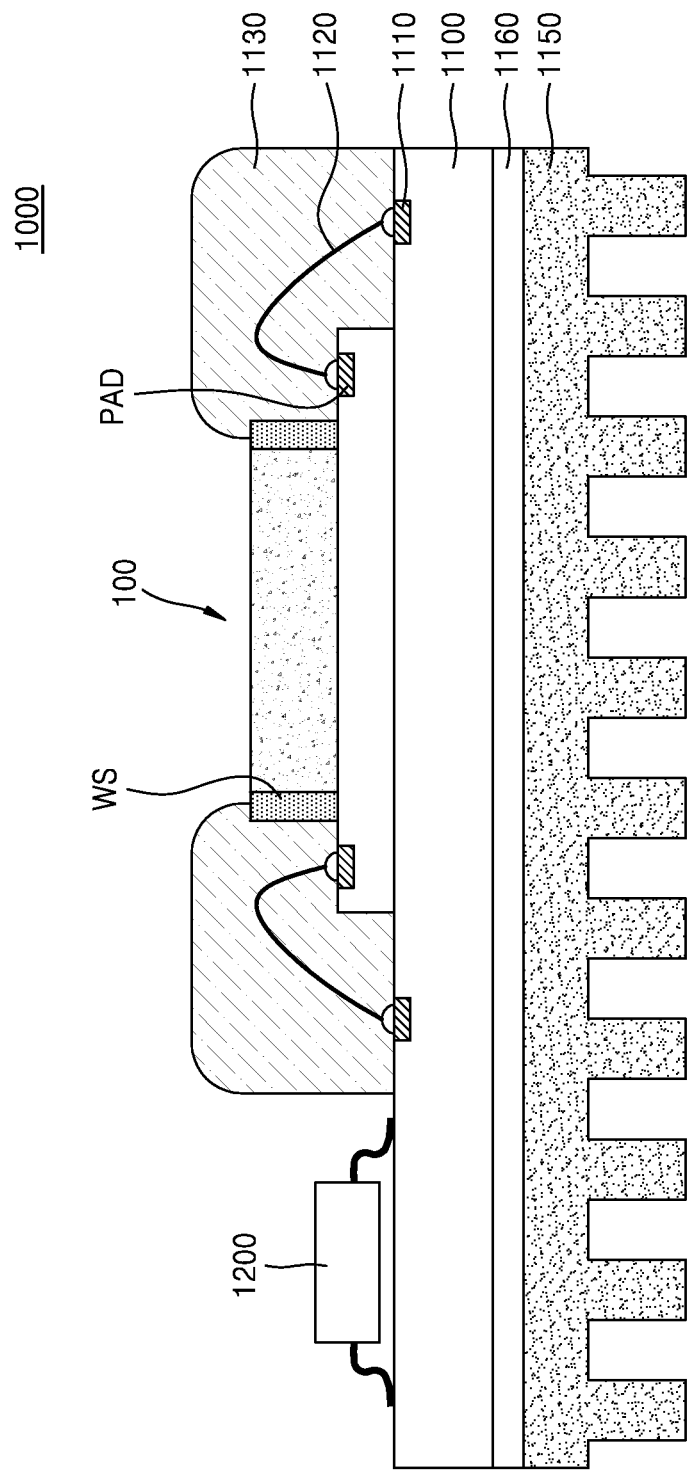
FIG. 18 is a cross-sectional view of a light source module including a light-emitting device, according to an example embodiment.

FIG. 18 is a cross-sectional view of a light source module 1000 including the light-emitting device 100 according to an example embodiment.

Referring to FIG. 18, the light source module 1000 may include the light-emitting device 100 and the driving semiconductor chip 1200 mounted on a printed circuit board (PCB) 1100.

The PCB 1100 may include an internal conductive pattern layer, and may include substrate pads 1110 electrically connected to the internal conductive pattern layer. The light-emitting device 100 may be mounted on the PCB 1100, and the pad portions PAD of the light-emitting device 100 may be connected to the substrate pads 1110 of the PCB 1100 through bonding wires 1120. One or more driving semiconductor chips 1200 may be configured to individually or collectively drive the plurality of light-emitting structures 120 of the light-emitting device 100.

A molding material 1130 surrounding an edge region of the light-emitting device 100 may be further arranged on the PCB 1100. The molding material 1130 may arranged to surround an outermost portion of the barrier wall structure WS of the light-emitting device 100 and cover the pad portions PAD and the bonding wires 1120.

A heat sink 1150 may be attached to a lower surface of the PCB 1100, and a thermal interface material (TIM) layer 1160 may be further arranged between the heat sink 1150 and the PCB 1100.

The light-emitting devices 100, 200, 300, and 400 may be mounted in the light source module 1000 separately or in combinations.

Figure 19:
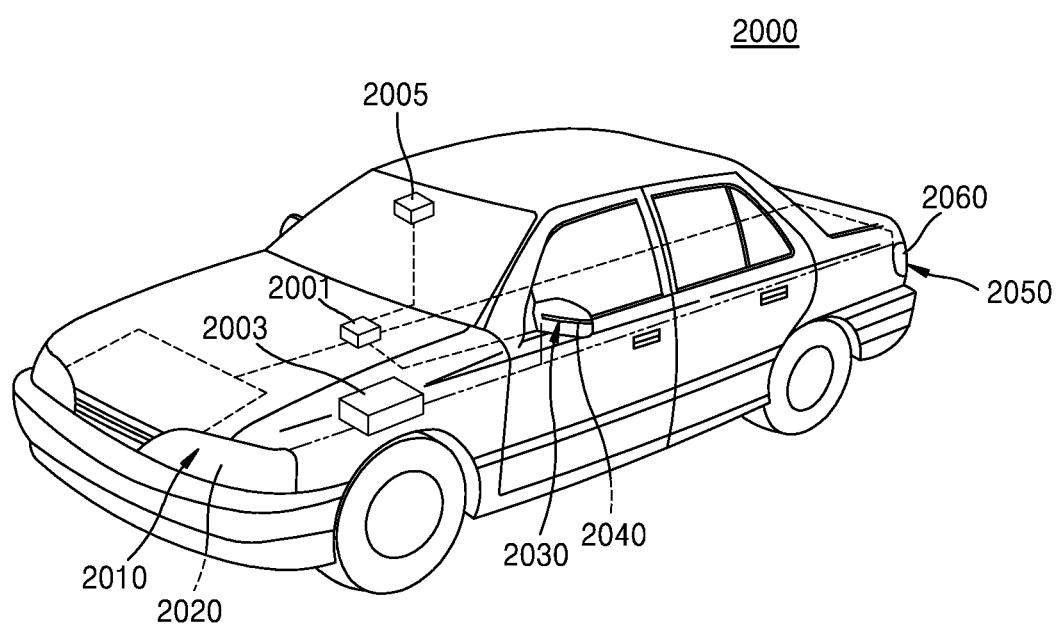
FIG. 19 is a perspective view of a vehicle according to an example embodiment.

FIG. 19 is a perspective view of a vehicle 2000 according to an example embodiment.

An automobile is illustrated as the vehicle 2000 in FIG. 19, but example embodiments are not limited thereto. The vehicle 2000 may include, but is not limited to, land transport means (such as two-wheeled vehicles, tricycles, passenger cars, caterpillars, trains, and trams), marine transport means (such as ships, boats, and submarines), and air transport means (such as airplanes and helicopters).

Referring to FIG. 19, a head lamp module 2020 may be provided in a head lamp unit 2010 of the vehicle 2000, a side view minor lamp module 2040 may be provided in an external side view minor unit 2030, and a tail lamp module 2060 may be provided in a tail lamp unit 2050.

The head lamp module 2020 may be a light source module including the light-emitting devices 100, 200, 300, and 400 separately or in combinations.

A power device 2003 built in the vehicle 2000 may provide power to each of the head lamp module 2020, the side view minor lamp module 2040, and the tail lamp module 2060. A controller 2001 built in the vehicle 2000 may be configured to control overall operations of the head lamp module 2020, the side view minor lamp module 2040, and the tail lamp module 2060, including an on-off operation.

The controller 2001 may be the driving semiconductor chip 1200 of FIG. 18, or may be electrically connected to the driving semiconductor chip 1200 of FIG. 18 and may be configured to control the driving semiconductor chip 1200 of FIG. 18.

The vehicle 2000 may further include a vision recognition device 2005. The vision recognition device 2005 may be configured to detect an object in front of the vehicle 2000 and its movement. The vision recognition device 2005 may include a camera capable of receiving a front view and converting the front view into digital data, a processor for identifying a position to which light emitted by the head lamp module 2020 should be radiated from a position that should not be irradiated, by using the converted digital data, and an output device capable of transmitting a result of the processing by the processor to the controller 2001.

Figure 20:
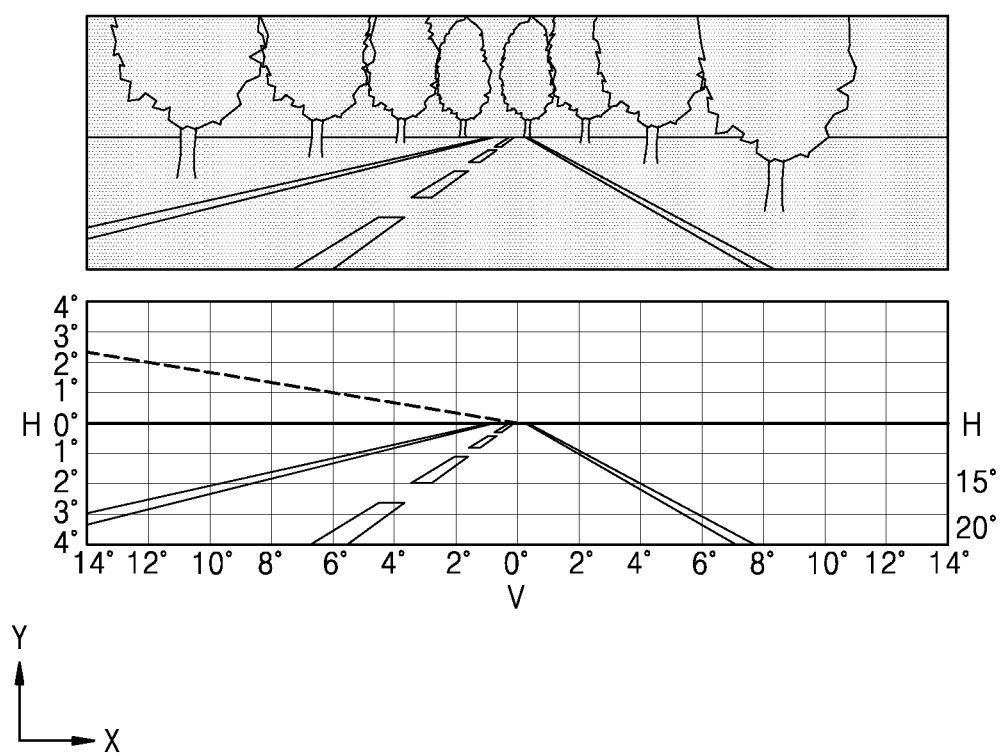
FIG. 20 is a schematic diagram showing a landscape recognized by a vision recognition device of the vehicle of FIG. 19.

FIG. 20 is a schematic diagram showing a landscape recognized by the vision recognition device 2005 of the vehicle 2000 of FIG. 19.

In detail, the upper drawing illustrates a recognized real landscape, and the lower drawing illustrates a result of extracting a main recognition object from the recognized real landscape.

Referring to FIGS. 19 and 20, the vehicle 2000 is located on the road, and the vision recognition device 2005 of the vehicle 2000 recognizes a vertical direction range of about −4° to about +4° by using a horizon H as a reference point in the vertical direction.

The vision recognition device 2005 also recognizes a horizontal direction range of about −14° to about +14° by using a front direction V as a reference point. Of course, example embodiments are limited thereto, and a person skilled in the art will understand that the recognition range in the vertical direction and/or the horizontal direction can be increased or decreased as necessary. The vision recognition device 2005 may be configured to individually identify a stationary object, a moving object, and the like within a viewing angle range.

Figure 21:
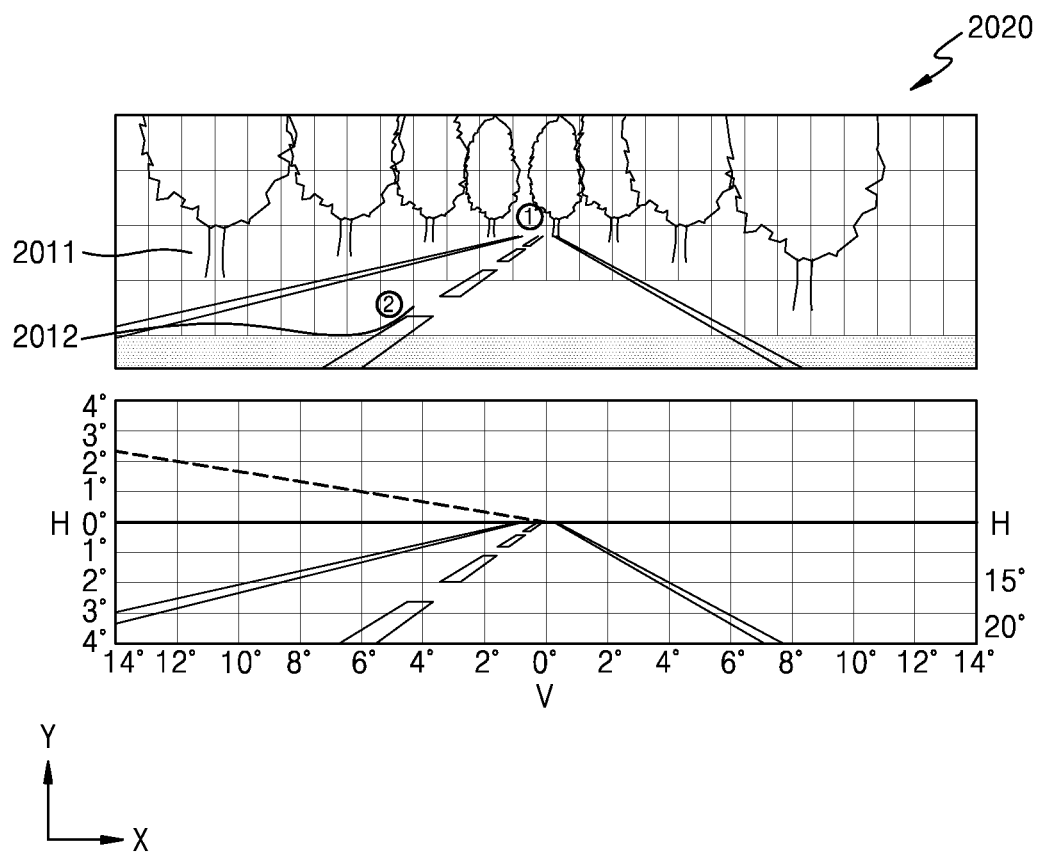
FIG. 21 is a conceptual diagram illustrating a range of light emitted by a head lamp module in the recognized landscape of FIG. 20.

FIG. 21 is a conceptual diagram illustrating a range of light emitted by a head lamp module in the recognized landscape of FIG. 20.

Referring to FIGS. 19 and 21, the light emitted by the head lamp module 2020 may illuminate an area ranging from about −1° to about +4° in the vertical direction, and may illuminate an area ranging from about −14° to about +14° in the horizontal direction.

The head lamp module 2020 may radiate light to an area corresponding to a high beam zone 2011 and a low beam zone 2012 sequentially disposed from the top to the bottom.

Each of the high beam zone 2011 and the low beam zone 2012 may be controlled to be on or off as needed. The on-off control of the high beam zone 2011 and the low beam zone 2012 may be performed by the controller 2001.

For example, when another vehicle approaches from the front of the road, the light emitted from the high beam zone 2011 may interfere with an operation of the other vehicle, because the light is configured to illuminate a position far away from a relatively high position. Accordingly, a portion of the area may be controlled to be off in correspondence with the location of the other vehicle approaching from the front so as not to interfere with the operation of the other vehicle.

In detail, the controller 2001 maintains the high beam zone 2011 in an on state in a dark environment. When another vehicle approaches from a location ① while the vehicle 2000 is running, the controller 2001 may turn off the high beam zone 2011 and turn on the low beam zone 2012. When the other vehicle passes through a location ② as the other vehicle gradually moves, the controller 2001 may turn on the high beam zone 2011 and turn off the low beam zone 2012.

As such, the recognition of the location of another vehicle approaching from the opposite road is recognized, and on-off control of the high beam zone 2011 and/or the low beam zone 2012 according to the recognized location may facilitate driving of the other approaching vehicle, thereby improving driving safety.

Although a case where there is one other approaching vehicle has been described in FIG. 21, example embodiments are not limited thereto, and the controller 2001 may operate in a similar manner even when there are two or more other vehicles approaching.

Figure 22:
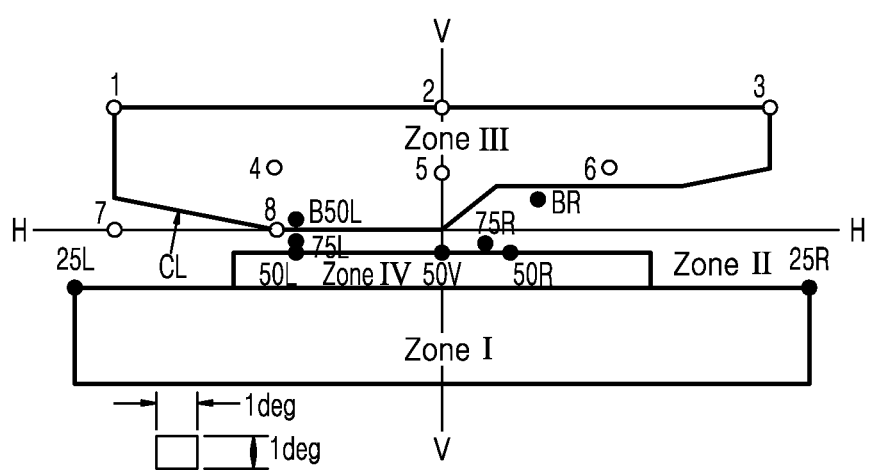
FIG. 22 is a conceptual diagram showing a luminous intensity grid prescribed by Article 112 of the Economic Commission for Europe (ECE) rule.

FIG. 22 is a conceptual diagram showing a photometric grid prescribed by Article 112 of the Economic Commission for Europe (ECE) rule.

Referring to FIG. 22, when a head lamp module is operated, certain values to be satisfied are described for each zone 25$m$ ahead and for each specific point.

In particular, in the case of zone III, some cut-off areas are defined in a diagonal direction, and these areas are referred to as cut-off lines CL.

In general, in order to implement the cut-off lines CL, attempts have been made to reduce the size of a light-emitting device or to precisely control a plurality of light-emitting devices. However, as the number of light-emitting elements to be controlled gradually increases, the number of driving elements increases and power consumption increases.

In the head lamp module 2020 for vehicles of FIG. 19 according to an example embodiment, the cut-off lines CL may be directly implemented by a high beam zone and a low beam area of the head lamp module 2020 of FIG. 19. As a result, there is no need to include a plurality of light-emitting modules in the head lamp module 2020 of FIG. 19, and power consumption may be reduced with a single light-emitting module.

Here, although only matters associated with Article 112 of the ECE Rule (R112) have been described above, a person skilled in the art may apply the same method to photometric grids according to ECE R98, ECE R113, ECE R123, and the Federal Motor Vehicle Safety Standard (FMVSS) of the United States.

Figure 23:
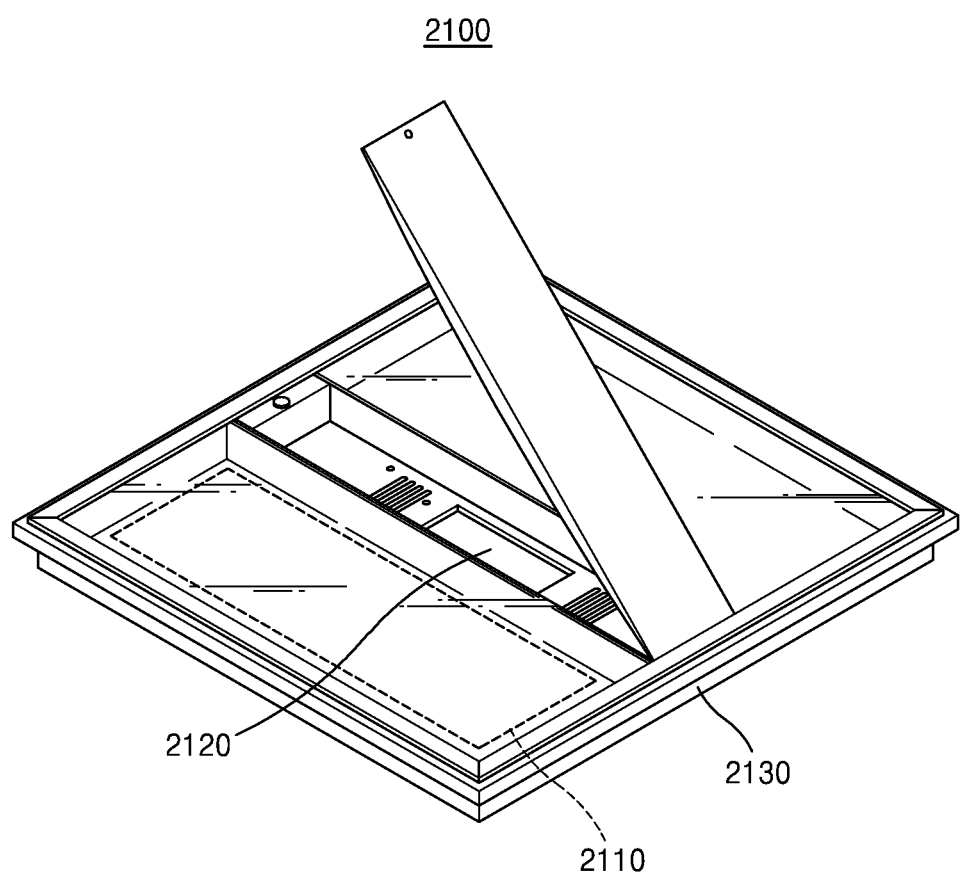
FIG. 23 is a perspective view of an illumination apparatus including a light-emitting device, according to an example embodiment.

FIG. 23 is a perspective view of an illumination apparatus including a light-emitting device, according to an example embodiment.

Referring to FIG. 23, a flat panel illumination apparatus 2100 may include a light source 2110, a power supply device 2120, and a housing 2130.

The light source module 2110 may include a light-emitting device array as a light source or may include at least one of the above-described light-emitting devices 100, 200, 300, and 400 as a light source. The light source module 2110 may have an overall flat shape.

The power supply device 2120 may be configured to supply power to the light source module 2110. The housing 2130 may form an accommodation space in which the light source module 2110 and the power supply device 2120 are accommodated, and may have a hexahedral shape with one open side. However, example embodiments are not limited thereto. The light source module 2110 may be disposed to emit light toward the open side of the housing 2130.

Figure 24:
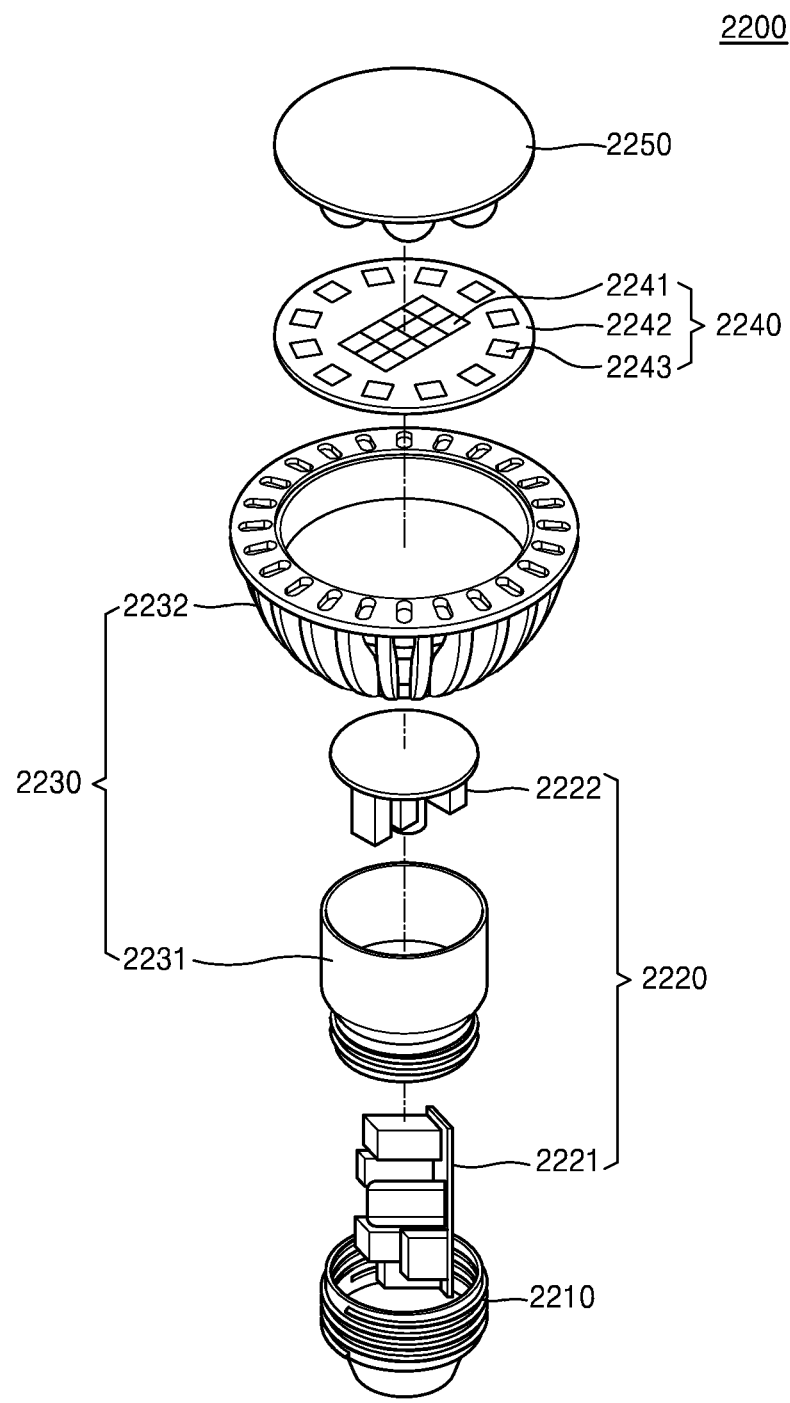
FIG. 24 is an exploded perspective view of an illumination apparatus including a light-emitting device, according to an example embodiment.

FIG. 24 is an exploded perspective view of an illumination apparatus including a light-emitting device, according to an example embodiment.

Referring to FIG. 24, an illumination apparatus 2200 may include a socket 2210, a power supply 2220, a heat dissipater 2230, a light source module 2240, and an optical unit 2250.

The socket 2210 may be configured to replace an existing illumination apparatus. Power supplied to the illumination apparatus 2200 may be applied via the socket 2210. The power supply 2220 may include a first power supply 2221 and a second power supply 2222. The heat dissipater 2230 may include an internal heat dissipater 2231 and an external heat dissipater 2232. The internal heat dissipation unit 2231 may be connected directly to the light source module 2240 and/or the power supply 2220 and may enable heat to be transmitted to the external heat dissipation unit 2232.

The light source module 2240 may receive power from the power supply 2220 and emit the light toward the optical unit 2250. The light source module 2240 may include a light-emitting device package 2241, a circuit board 2242, and a controller 2243, where the controller 2243 may store information for driving the light-emitting device package 2241. The light-emitting device package 2241 may include at least one of the above-described light-emitting devices 100, 200, 300, and 400 as a light source.

The optical unit 2250 may include an inner optical unit and an outer optical unit and may be configured to uniformly disperse light emitted by the light source module 2240.

While example embodiments have been shown and described, it will be understood that various changes in form and details may be made therein without departing from the spirit and scope of the following claims.

What is claimed is:

1. A light-emitting device comprising:
a plurality of first light-emitting structures provided in a first light-emitting pixel region;
a plurality of second light-emitting structures provided in a second light-emitting pixel region adjacent to the first light-emitting pixel region;
a barrier wall structure defining a plurality of regions in the first light-emitting pixel region and a single region in the second light-emitting pixel region;
a passivation structure provided on an upper surface and sidewalls of the barrier wall structure;
a first fluorescent layer provided in the plurality of regions; and
a second fluorescent layer provided in the single region, wherein a shape of the first fluorescent layer is different from a shape of the second fluorescent layer.

2. The light-emitting device of claim 1, wherein the barrier wall structure is provided between the plurality of first light-emitting structures, and
wherein the first fluorescent layer is provided in spaces defined by the barrier wall structure in the first light-emitting pixel region.

3. The light-emitting device of claim 2, wherein an upper portion of the first fluorescent layer has a convex shape.

4. The light-emitting device of claim 3, wherein the first fluorescent layer is formed using a dispensing process, and
wherein the second fluorescent layer comprises a phosphor in glass (PIG).

5. The light-emitting device of claim 1, wherein the barrier wall structure defines a continuous space that comprises the plurality of second light-emitting structures, and
wherein the second fluorescent layer is provided in the continuous space and comprises a phosphor in glass (PIG).

6. The light-emitting device of claim 5, wherein an upper of portion of the second fluorescent layer has a flat shape.

7. The light-emitting device of claim 1, wherein the first light-emitting pixel region and the second light-emitting pixel region are provided in one module, and
wherein a first area of the first light-emitting pixel region is greater than a second area of the second light-emitting pixel region.

8. The light-emitting device of claim 7, wherein the plurality of first light-emitting structures are provided in a plurality of rows, and
wherein the plurality of second light-emitting structures are provided in a single row.

9. The light-emitting device of claim 1, wherein a first plurality of pixels are provided in the first light-emitting pixel region,
wherein a second plurality of pixels are provided in the second light-emitting pixel region,
wherein the first fluorescent layer is individually provided in each of the first plurality of pixels, and
wherein the second fluorescent layer is continuously provided over each of the second plurality of pixels.

10. The light-emitting device of claim 1, further comprising an insulation liner provided between a wiring structure and the barrier wall structure, wherein the insulation liner extends along a recessed area formed in a lower surface of the barrier wall structure.

11. A light-emitting device comprising:
a plurality of light-emitting structures provided in a light-emitting pixel region;
a barrier wall structure that is vertically offset from the plurality of light-emitting structures in the light-emitting pixel region, the barrier wall structure comprising a plurality of barrier walls that define a plurality of pixel spaces;
a passivation structure provided on an upper surface and sidewalls of the barrier wall structure;
a fluorescent layer provided in the plurality of pixel spaces; and
a pad portion provided in a pad region on a first side of the plurality of light-emitting structures,
wherein the light-emitting pixel region comprises a first light-emitting pixel region and a second light-emitting pixel region,
wherein the fluorescent layer comprises:
a plurality of first fluorescent layers respectively provided on the plurality of light-emitting structures provided in the first light-emitting pixel region, and
a continuous fluorescent layer continuously provided on the plurality of light-emitting structures in the second light-emitting pixel region.

12. The light-emitting device of claim 11, wherein an upper portion of each of the plurality of first fluorescent layers has a convex shape, and
wherein an upper portion the continuous fluorescent layer has a flat shape.

13. The light-emitting device of claim 11, wherein each of the plurality of light-emitting structures provided in the first light-emitting pixel region are separated from each other by the barrier wall structure, and
wherein the plurality of light-emitting structures provided in the second light-emitting pixel region are provided in one of the plurality of pixel spaces.

14. The light-emitting device of claim 11, wherein the plurality of light-emitting structures provided in the first light-emitting pixel region are arranged in a plurality of rows and occupy a first area, and wherein the plurality of light-emitting structures provided in the second light-emitting pixel region are arranged in a single row line and occupy a second area that is smaller than the first area.

15. The light-emitting device of claim 11, wherein the light-emitting pixel region comprises a cut-off line of a photometric grid according to Economic Commission for Europe (ECE) R98, ECE R113, ECE R123, or Federal Motor Vehicle Safety Standard (FMVSS), and
wherein the cut-off line corresponds to a boundary between the first light-emitting pixel region and the second light-emitting pixel region.

16. A head lamp for vehicles comprising:
a plurality of first light-emitting structures provided in a first light-emitting pixel region;
a plurality of second light-emitting structures provided in a second light-emitting pixel region being adjacent to the first light-emitting pixel region;
a barrier wall structure defining a plurality of regions in the first light-emitting pixel region and a single region in the second light-emitting pixel region;
a passivation structure provided on an upper surface and sidewalls of the barrier wall structure;
first fluorescent layers provided in the first light-emitting pixel region; and
a second fluorescent layer provided in the second light-emitting pixel region,
wherein a shape of the first fluorescent layers and is different from a shape of the second fluorescent layer.

17. The head lamp for vehicles of claim 16, wherein the first light-emitting pixel region and the second light-emitting pixel region are provided in one module, and
wherein a first area of the first light-emitting pixel region is greater than a second area of the second light-emitting pixel region.

18. The head lamp for vehicles of claim 17, wherein the plurality of first light-emitting structures are separated from each other by the barrier wall structure, and
wherein the first fluorescent layers are provided in spaces defined by the barrier wall structure in the first light-emitting pixel region.

19. The head lamp for vehicles of claim 16, wherein the barrier wall structure defines a continuous space that comprises the plurality of second light-emitting structures, and
wherein the second fluorescent layer comprises a phosphor in glass (PIG), a single crystal phosphor, a ceramic phosphor, or a resin containing a phosphor.

20. The head lamp for vehicles of claim 16, further comprising a printed circuit board (PCB),
wherein the plurality of first light-emitting structures and the plurality of second light-emitting structures are mounted on the PCB.

* * * * *